US010705424B2

United States Patent
Chen et al.

(10) Patent No.: US 10,705,424 B2
(45) Date of Patent: Jul. 7, 2020

(54) NEGATIVE-WORKING PHOTORESIST COMPOSITIONS FOR LASER ABLATION AND USE THEREOF

(71) Applicant: AZ ELECTRONIC MATERIALS (LUXEMBOURG) S.ÀR. L., Luxembourg (LU)

(72) Inventors: Chunwei Chen, Whitehouse Station, NJ (US); Weihong Liu, Bridgewater, NJ (US); Ping-Hung Lu, Bridgewater, NJ (US)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 15/628,711

(22) Filed: Jun. 21, 2017

(65) Prior Publication Data

US 2017/0285475 A1    Oct. 5, 2017

Related U.S. Application Data

(62) Division of application No. 14/976,498, filed on Dec. 21, 2015.

(51) Int. Cl.
*G03F 7/20* (2006.01)
*G03F 7/038* (2006.01)
(Continued)

(52) U.S. Cl.
CPC ............ *G03F 7/038* (2013.01); *G03F 7/0035* (2013.01); *G03F 7/0048* (2013.01); *G03F 7/027* (2013.01);
(Continued)

(58) Field of Classification Search
CPC .......... G03F 7/038; G03F 7/031; G03F 7/162; G03F 7/16; G03F 7/168; G03F 7/2004;
(Continued)

(56) References Cited

U.S. PATENT DOCUMENTS 3,615,455 A    10/1971    Laridon et al.
3,784,557 A    1/1974    Cescon
(Continued)

FOREIGN PATENT DOCUMENTS

EP    1193557 A1    4/2002
JP    06-328698 A    11/1994
(Continued)

OTHER PUBLICATIONS

Sarwar et al., "Excimer laser ablation of high aspect ratio microvias using a novel sensitizer-enhanced photopolymer" J. Microelectron. Electron.Pack., vol. 8 pp. 66-71 (2011).*
(Continued)

*Primary Examiner* — Martin J Angebranndt
(74) *Attorney, Agent, or Firm* — Francis M. Houlihan

(57) ABSTRACT

A composition crosslinkable by broad band UV radiation, which after cross-linking is capable of cold ablation by a UV Excimer Laser emitting between 222 nm and 308 nm, where the composition is comprised of a negative tone resist developable in aqueous base comprising and is also comprised of a conjugated aryl additive absorbing ultraviolet radiation strongly in a range between from about 220 nm to about 310 nm.
The present invention also encompasses a process comprising steps a), b) and c)
a) coating the composition of claim 1 on a substrate;
b) cross-linking the entire coating by irradiation with broadband UV exposure;
c) forming a pattern in the cross-linked coating by cold laser ablating with a UV excimer laser emitting between 222 nm and 308 nm. Finally the present invention also encompasses
The present invention also encompasses a process comprising steps a'), b') c') and d')
(Continued)

1. Comparative Formulation Example 1 @ 100% cured: no ablation under 308nm laser and no via formed 2. Comparative Formulation Example 1 @ 25% cured: no ablation under 308nm laser and no via formed 3. Formulation Example 1 @ 100% cured: ablated under 308nm laser and via formed a) coating the composition of claim 1 on a substrate;
b) cross-linking part of the coating by irradiation with broadband UV exposure through a mask;
c) developing the coating with aqueous base removing the unexposed areas of the film, thereby forming a first pattern;
d) forming a second pattern in the first pattern by laser cold laser ablating of the first pattern with a UV excimer laser emitting between 222 nm and 308 nm.

7 Claims, 1 Drawing Sheet

(51) Int. Cl.
G03F 7/031 (2006.01)
G03F 7/033 (2006.01)
G03F 7/027 (2006.01)
G03F 7/16 (2006.01)
G03F 7/32 (2006.01)
G03F 7/004 (2006.01)
G03F 7/095 (2006.01)
G03F 7/00 (2006.01)

(52) U.S. Cl.
CPC ............ G03F 7/031 (2013.01); G03F 7/033 (2013.01); G03F 7/0382 (2013.01); G03F 7/095 (2013.01); G03F 7/16 (2013.01); G03F 7/162 (2013.01); G03F 7/168 (2013.01); G03F 7/2004 (2013.01); G03F 7/2006 (2013.01); G03F 7/2022 (2013.01); G03F 7/2024 (2013.01); G03F 7/2053 (2013.01); G03F 7/322 (2013.01)

(58) Field of Classification Search
CPC ........ G03F 7/20; G03F 7/2006; G03F 7/2022; G03F 7/0048; G03F 7/32; G03F 7/322; G03F 7/033; G03F 7/0035; G03F 7/2053; G03F 7/027; G03F 7/2024; G03F 7/095
See application file for complete search history.

(56) References Cited

U.S. PATENT DOCUMENTS

| | | | |
|---|---|---|---|
| 4,252,887 A | 2/1981 | Dessauer | |
| 4,311,783 A | 1/1982 | Dessauer | |
| 4,410,621 A | 10/1983 | Wada et al. | |
| 4,459,349 A | 7/1984 | Tanaka et al. | |
| 4,540,598 A | 9/1985 | Berner et al. | |
| 4,622,289 A | 11/1986 | Sheets | |
| 5,314,709 A | 5/1994 | Doany et al. | |
| 5,460,921 A * | 10/1995 | Cywar | G03F 7/00 216/20 |
| 5,627,011 A | 5/1997 | Munzel et al. | |
| 5,925,500 A * | 7/1999 | Yang | G03F 7/202 430/273.1 |
| 6,313,188 B1 | 11/2001 | Takahashi | |
| 6,576,394 B1 | 6/2003 | Xu et al. | |
| 6,693,656 B1 | 2/2004 | Koide | |
| 7,195,855 B2 * | 3/2007 | Arao | G03F 7/038 430/270.1 |
| 7,264,912 B2 | 9/2007 | Hioki et al. | |
| 7,425,400 B2 | 9/2008 | Goto | |
| 7,543,592 B2 | 6/2009 | Lee | |
| 7,601,482 B2 | 10/2009 | Pawlowski et al. | |
| 8,906,594 B2 | 12/2014 | Chen et al. | |
| 9,012,126 B2 | 4/2015 | Liu et al. | |
| 9,074,087 B2 | 7/2015 | Chen et al. | |
| 2001/0047061 A1 | 11/2001 | Doi et al. | |
| 2002/0061464 A1 | 5/2002 | Aoai et al. | |
| 2004/0013977 A1 | 1/2004 | Steinman | |
| 2004/0170920 A1 * | 9/2004 | Goto | B41C 1/1016 430/271.1 |
| 2004/0175653 A1 | 9/2004 | Zuang et al. | |
| 2006/0115970 A1 * | 6/2006 | Lee | C11D 7/3209 438/584 |
| 2006/0223284 A1 | 10/2006 | Li et al. | |
| 2007/0231735 A1 * | 10/2007 | Pawlowski | G03F 7/027 430/270.1 |
| 2010/0068649 A1 | 3/2010 | Sensaki et al. | |
| 2011/0300482 A1 | 12/2011 | Suzuki et al. | |
| 2012/0099214 A1 | 4/2012 | Lee et al. | |
| 2012/0259031 A1 | 10/2012 | Dake et al. | |
| 2013/0045376 A1 * | 2/2013 | Chen | C09J 7/22 428/317.3 |
| 2013/0337380 A1 * | 12/2013 | Liu | G03F 7/004 430/285.1 |
| 2013/0337381 A1 * | 12/2013 | Chen | C08F 220/18 430/285.1 |

FOREIGN PATENT DOCUMENTS

| | | | | |
|---|---|---|---|---|
| JP | 1994-328698 A | 11/1994 | | |
| JP | 2001-324811 | * 11/2001 | ............ | G03F 7/038 |
| JP | 2001-324811 A | 11/2001 | | |
| JP | 2008-106213 A | 5/2008 | | |
| JP | 2008-276167 A | 11/2008 | | |

OTHER PUBLICATIONS

Lippert et al. "Laser ablation of doped polymer systems", Adv. Mater., vol. 9(2) pp. 105-119 (1997).*
JSR micro, "JSR Negative tone THB photoresists", 3 pages downloaded Sep. 4, 2019.*
Bhattacharyya et al., "A Laser Flash Photolysis Study of Sydnone Triplets. Photophysical Behaviours and Singlet Oxygen Sensitisation", J. Indian Chem. Soc. vol. LXIII, pp. 43-pp. 49 (Jan. 1986).
Tai-Chang Chen and Robert Bruce Darling (2012). Fundamentals of Laser Ablation of the Materials Used in Microfluiducs, Micromachining Techniques for Fabrication of Micro and Nano Structures, Dr. Mojtaba Kahrizi (Ed.), ISBN: 978-953-307-906-6, InTech, Available from: http://www.intechopen.com/books/micromachiningtechniques-for-fabrication-of-micro-and-nano-structures/fundamentals-of-laser-ablation-of-the-materials-usedin-Microfluidics.
Fardel et al., "Influence of thermal diffusion on the laser ablation of thin polymer films", Appl. Phys. A vol. 90, pp. 661-pp. 667 (2008).
Fardel et al., "Laser ablation of aryltriazene photopolymer films: Effects of polymer structure on ablation properties", Applied Surface Science vol. 254, pp. 1332-pp. 1337 (2007).
Hiraoka et al., "Dopant-induced ablation of polymers by a 308 nm excimer laser", J. Vac. Sci. Technol. B vol. 6 No. 1, 463-pp. 465 (Jan./Feb. 1988).
Hoogen et al., "Synthesis and Photoreactions of Polyesters Containing Triazene and Cinnamylidene Malonyl Units", Journal of Polymer Science: Part A: Polymer Chemistry vol. 38, pp. 1903-pp. 1910 (2000).
Lippert et al., "Dopant-induced laser ablation of PMMA at 308 nm: Influence of the molecular weight of PMMA and of the photochemical activity of added chomophores", Die Angewandte Makromolekulare Chemie vol. 213 No. 3721, pp. 127-pp. 155 (1993).
Lippert et al., "Excimer Laser Ablation of Novel Triazene Polymers: Influence of Structural Parameters on the Ablation Characteristics", J. Phys. Chem. vol. 97, pp. 12296-pp. 12301 (1993).
Nuyken et al., "Laser Ablation of Arylazo Containing Polymers", Polymer News vol. 24, pp. 257-pp. 266 (1999).
Pacher et al., "Microstructuring of resist double layers by a femtosecond laser ablation and UV lithography hyprid process", SPIE vol. 8968, pp. 89680O-1-pp. 89680O-8 (2014).
Sarwar et al., "Excimer Laser Ablation of High Aspect Ration Microvias Using a Novel Sensitizer-Enhanced Photopolymer", Journal of Microelectronics and Electronic Packaging vol. 8, pp. 66-pp. 71 (2011).

(56) References Cited

OTHER PUBLICATIONS

Suzuki et al., "Polymer resist materials for excimer ablation lithography", Applied Surface Science vol. 127-129, pp. 905-pp. 910 (1998).
Wei et al., "Characterisation of combined positive-negative photoresists by excimer laser ablation", Appl. Phys. A vol. 69, pp. S849-pp. S853 (1999).
Wei et al., "Novel Laser Ablation Resists for Excimer Laser Ablation Lithography. Influence of Photochemical Properties on Ablation", J. Phys. Chem. B vol. 105, pp. 1267-pp. 1275 (2001).
Lippert et al., "Chemical and Spectroscopic Aspects of Polymer Ablations: Special Features and Novel Directions"Chem. Rev. 2003, 103, 453-485.
International Search Report, PCT/EP2016/081903, dated Sep. 5, 2017, corresponds to U.S. Appl. No. 14/976,498.
Jian et al., "Synthesis and photopolymerization kinetics of 2-(4-methoxyphenyl)-4, 6-bis (trichloromethyl)-S-triazine photoinitiator", Yingxiang Kexue Yu Guang Huaxue vol. 29(2) pp. 99-107 (2011)_Japanese and machine translation.
Machine translation of JP06-328698, Nov. 29, 1994.
Karmann, et al., "Tapes, Adhesives", Ullman's Encyclopedia of Industrial Chemistry, vol. 35, pp. 612-631, 2012 Wiley-VCH Verlag GmbH & Co, KGaA, Weinheim.
Machine translation of JP1994-328698A, Nov. 29, 1994.
Irgacure 651 data sheet (Ciba) 3 pages.
Ullmann's Encyclopedia of Industrial Chemistry V35 p. 610 2012.
Machine Translation of JP2001-324811, Nov. 22, 2001.

\* cited by examiner

1. Comparative Formulation Example 1 @ 100% cured: no ablation under 308nm laser and no via formed
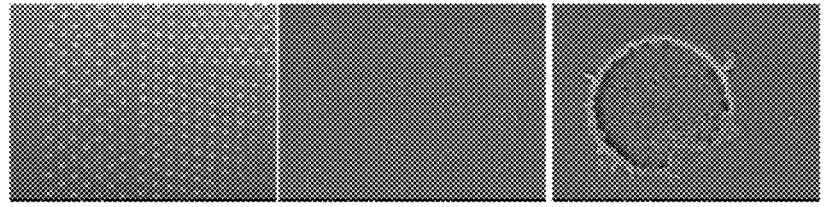
2. Comparative Formulation Example 1 @ 25% cured: no ablation under 308nm laser and no via formed
3. Formulation Example 1 @ 100% cured: ablated under 308nm laser and via formed
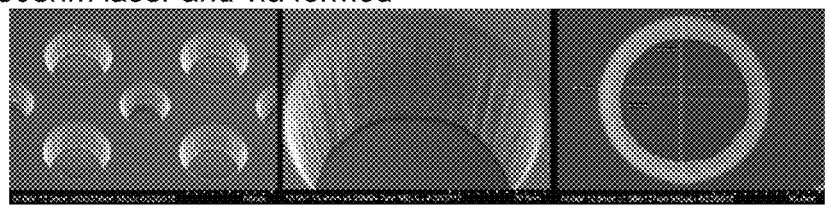

NEGATIVE-WORKING PHOTORESIST COMPOSITIONS FOR LASER ABLATION AND USE THEREOF

This application is a United States Divisional Application which claims priority to U.S. non-provisional application Ser. No. 14/976,498 filed Dec. 21, 2015, the contents of which is being hereby incorporated herein by reference.

Disclosed are novel compositions whose films coated on a substrate are both phenolic negative tone crosslinking resist sensitive to broadband UV radiation and in areas exposed to this broadband radiation also are pattern-able by cold laser ablation with an Excimer laser emitting at a wavelength between 222 nm and 308 nm and also capable of being coated as thick films.

Also disclosed are novel methods of making relief images by imaging films coated from this composition through cold laser ablation with an excimer laser emitting at a wavelength between 222 nm and 308 nm a film of these novel composition coated on a substrate that have been previously been cross-linked by broadband exposure.

Also further disclosed is another novel method of making images with the novel composition which is to cold laser ablate with an excimer laser emitting at a wavelength between 222 nm and 308 nm a topographical image previously imaged into a film of the novel composition on a substrate by exposure with a Broadband UV exposure through a mask and development with an aqueous base.

The relief images prepared from these novel compositions and methods can be used in the formation of metal bumps and posts useful for electronic innerlayer interconnections. They can also be used as templates for electrochemical deposition of metal wiring patterns. These photofabrication methods have found utility in such application as chip scale packaging, microelectronic machine systems, high density interconnections, liquid crystal devices, organic transistors, light emitting diode, displays and the like.

The manufacture of many electronic components can often only easily be achieved with the use of thick film photosensitive photoresist materials, compositions and methods. The process involves coating a desired substrate with a photosensitive photoresist composition and drying followed by exposing the photoresist to actinic radiation through a photomask which contains the desired pattern of line traces, bump holes and other structures. In the case of a negative photoresist the exposed areas are hardened, while when exposing through a mask the unexposed areas are removed by a suitable developing solution, generally aqueous based. In many photofabrication processes the thickness of the coated and dried photoresist is required to be 30 microns while the line traces, bump holes and other structures have dimension that can be at least 15 microns. Once the line traces, bumps and other structures are fabricated the photoresist is removed in a stripping process again typically using aqueously based solutions.

Cold laser ablation is achieved when the laser excitation results in direct bond scission. Specifically, this is a photochemical process in which the temperature of the system is unchanged. This is typically done with a UV Excimer Laser emitting between 222 nm and 308 nm.

The Inventive formulations of this application are comprised of a negative tone resist which when coated on a substrate are sensitive to broadband UV radiation whose imaging at this wavelength operates through a crosslinking reaction induced by broadband radiation, but which are also sensitivity to cold laser ablation with a UV Excimer laser emitting between 222 nm and 308 nm.

These novel composition contain the following:
1) components which allow the composition to be coated as a thick film on a substrate and impart to these coatings on a substrate the property of being a negative tone, crosslinking, base developable resist coating sensitive to broadband radiation and
2) at least one additional sensitizer component which after broadband exposed film coated and exposed to broadband radiation sensitivity to cold laser ablation.

The components for imparting negative tone broadband sensitivity a base soluble resin comprised of phenolic moieties, carboxylic acid moieties or a combination of both types moieties such that the resin dissolves in aqueous base, an organic solvent which can dissolve all components of the novel composition and make the composition suitable for coating thick film on a substrate; at least one crosslinker; at least one photoinitiator sensitive to broadband irradiation.

The additive which sensitizes the coating composition to cold laser ablation with an Excimer laser between 222 nm and 308 nm is comprised of a conjugated aryl compound absorbing ultraviolet radiation strongly from about 222 nm to about to about 310 nm.

In these novel composition the cross-linker is induced by broadband irradiation to undergo a crosslinking reaction in the coated film of the phenolic composition. This crosslinking induced by broadband irradiation occurs through a mechanism where the phenolic resin and the crosslinker are induced to undergo crosslinking by radical, cation, acid or a combination of these moieties generated a photoinitiator system sensitive to broadband UV irradiation.

The broadband photoinitiator system in this composition is comprised of a photoacid generator additive, photoradical generator additive or a combination of both type of photoinitiators. These photoinitators may be inherently sensitive to broadband irradiation or alternatively are sensitized to broadband irradiation by an appropriate broadband sensitizer additive.

Areas of the composition coated on a substrate, not exposed to broadband radiation maintain solubility in aqueous base while areas exposed are crosslinked generating a negative tone image upon aqueous base development.

Because this novel composition is also comprised of laser ablation additives the coated films of this material, after broadband UV exposed films are very susceptible cold laser ablation with an Excimer laser emitting UV radiation between 222 nm and 308 nm producing.

This invention also pertains for the novel use of such novel coating formulations in two imaging approaches.

In the first approach, a cross-linked film is produced by blanket flood exposure with broadband radiation of a film of the novel composition cast on a substrate; images are then produced by ablation with the Excimer laser in select areas of the cross-linked film.

In the second imaging approach, an image produced by conventional exposure of the of a film of the novel composition cast on a substrate to broadband radiation through a mask followed by aqueous base development and removal of the non-exposed area to produce a first topographical image; however, this first topographical images may subsequently be modified by cold Excimer laser ablation ablating away selected topographical areas of first image.

In both kinds of processes, features such as deep contact holes, vias and other topographical features are formed by cold laser ablation that are be produced having stepper profiles, smoother sidewalls with fewer Excimer laser pulse than conventional laser ablation formulations.

Excimer Cold Laser ablation of conventional non-imageable, non-crosslinking polymeric resins has several drawbacks as follows:

Simple Polymer are susceptible to thermal flow unless a cure step is added and the formulation is made to be thermally curable. Also, the polymer needs to also be designed with a chemical resistance to the etching processes subsequently employed for pattern transfer to the substrate in the manufacture of MEM's Sensors and other microelectronic components. Moreover, such polymers may not be soluble in environmentally friendly spin casting solvents.

Negative broadband resists suitable as component in our novel laser ablation composition must have several properties which make them suitable for use as a component in our novel cold laser ablation formulations as follows.

1) They must be imageable with broadband exposure.
2) Developable in aqueous base.
3) Imaged upon broadband exposure through the action of at least one crosslinking additive which crosslinkable through the action of an acid, a radical or both 4) Contain a photoacid generator, photoradical generator which is inherently sensitive to broadband or is sensitive to broadband when combined with a broadband sensitizer.
5) Formulated in an environmentally safe spin casting solvent The other component in our novel composition are additives which impart sensitivity to cold laser ablation with an Excimer laser emitting UV radiation between 222 nm and 308 nm. These additives must impart to the above described negative resist a high ablation rate with these Excimer lasers. They must also be soluble in the environmentally safe spin casting solvent.

The novel compositions and processes of this invention solve the problem of forming precise features in thick films 5-100 μm through cold laser ablation where the features have high aspect ratios and also have high wall angles, and low sidewall roughness and at the same time have a high ablation rate with an Excimer laser emitting at a wavelength between 222 nm and 308 nm. The ability to make such features is useful in the manufacturing of MEMS, sensors and other microelectronic components.

SUMMARY OF THE INVENTION

A composition for a negative tone, aqueous base developable, broadband UV resist which is also sensitive to in the areas exposed to broadband irradiation to subsequent cold laser ablation by an UV Excimer Laser emitting between 222 nm and 308 nm where the composition is comprised of components a) and b) wherein;
a) are components for imparting negative tone, aqueous base developable, broadband UV resist behavior comprised of
  i) a resin containing phenolic moieties, carboxylic acid moieties or a combination of both types moieties such that the resin dissolves in aqueous base;
  ii) at least one cross-linker;
  iii) at least one photo-initiator sensitive to broadband irradiation; and
b) a cold laser ablation excimer laser sensitizer component system comprised of at least one conjugated aryl additive absorbing ultraviolet radiation strongly in a range between from about 220 nm to about 310 nm The present invention also encompasses a process comprising steps a), b) and c)
a) coating the composition of claim 1 on a substrate;
b) cross-linking the entire coating by irradiation with broadband UV exposure;
c) forming a pattern in the cross-linked coating by cold laser ablating with a UV excimer laser emitting between 222 nm and 308 nm. Finally the present invention also encompasses The present invention also encompasses a process comprising steps a'), b') c') and d')
a') coating the composition of claim 1 on a substrate;
b') cross-linking part of the coating by irradiation with broadband UV exposure through a mask;
c') developing the coating with aqueous base removing the unexposed areas of the film, thereby forming a first pattern;
d') forming a second pattern in the first pattern by laser cold laser ablating of the first pattern with a UV excimer laser emitting between 222 nm and 308 nm.

DETAILED DESCRIPTION OF DRAWINGS

FIG. 1 Comparative Study Top Down SEM Pictures: Comparative Formulation Example 1: and Formulation Example 1.

DETAILED DESCRIPTION

Throughout the present specification, unless otherwise stated the terms used are described below.

As used herein, the conjunction "and" is intended to be inclusive and the conjunction "or" is not intended to be exclusive unless otherwise indicated. For example, the phrase "or, alternatively" is intended to be exclusive.

As used herein the terms "photocure" and "photopolymerize" are used interchangeably and refer to free radical initiated curing or polymerization.

As used herein the term "dried" refers to films with less than 5% solvent remaining after the drying process.

As used herein the term "thick film" refer to films which are between 5-100 microns thick.

As used herein the term "phenolic" refers to an aryl moiety on which at least one hydroxyl group is present attached to an aromatic ring.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. non-cyclic). Suitable acyclic groups can be methyl, ethyl, n- or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moiety. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein.

Suitable bicyclic alkyl groups include substituted bicycle [2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo [5.4.0.0.$^{2,9}$]undecane, tricyclo[4.2.1.2.$^{7,9}$]undecane, tricyclo [5.3.2.0.$^{4,9}$]dodecane, and tricyclo[5.2.1.0.$^{2,6}$]decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_6$)alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[5.2.1.0.$^{2,6}$]decane.

Aryl groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

The term (meth)acrylate refers to methacrylate or acrylate, and similarly, (meth)acrylic refers to methacrylic or acrylic.

The term acid cleavable group refers to a protecting group masking a alcohol, phenol, or carboxylic acid functionality which can be cleaved through a acid initiated catalytic process such as acidolysis where or hydrolysis where the chain length of the catalytic process entails a some juncture a sufficiently stable carbocation intermediate to sustain a long catalytic chain. Examples of such moieties are the following:

tertiary, secondary benzylic, secondary allylic, (or other activated secondary carbocations containing a substituent stabilizing the carbocation) which contain at least one proton on a carbon atom adjacent capable of being abstracted to regenerate the acid;

carbocation to which two oxygen atoms are attached to the carbon containing the positive charge, such as are formed in the hydrolysis of acetals and ketals;

silyl cations on which are attached three carbon atoms as are formed in the hydrolysis of moieties such as trialkylsilyl ethers or esters triarylsilyl ethers or ester, and diarylalkylsilyl ethers or esters and the like. The term acid cleavable bond refers to the bond undergoing acid catalyzed cleavage in the above acid cleavable groups and the like.

Such acid cleavable groups are generally used in chemically amplified resist processes were the acid originates from a photo-acid generator (PAG) and the catalytic process amplifies the quantum yield for photo-generation of acid. These groups may also be cleaved by acid originating thermally from a thermal acid generator (TAG). Materials which undergo ineffective hydrolysis such as materials that undergo hydroxylis through a primary carbocations, or unactivated secondary carbocations are not considered as acid cleavable group nor are materials that undergo ineffective hydrolysis through a tertiary or secondary carbocation because they do not have an abstractable hydrogen to reform the acid in an acidolysis process as described above.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

Compositions

One aspect of this invention is a composition for a negative tone, aqueous base developable, broadband UV resist which is also sensitive to in the areas exposed to broadband irradiation to subsequent cold laser ablation by an UV Excimer Laser emitting between 222 nm and 308 nm where the composition is comprised of components a) and b);

a) components for imparting negative tone, aqueous base developable, broadband UV resist behavior
  i) a resin containing phenolic moieties, carboxylic acid moieties or a combination of both types moieties such that the resin dissolves in aqueous base;
  ii) at least one cross-linker;
  iii) at least one photo-initiator sensitive to broadband irradiation; and b) a cold laser ablation excimer laser sensitizer component system comprised of at least one conjugated aryl additive absorbing ultraviolet radiation strongly in a range between from about 220 nm to about 310 nm In another aspect of this novel composition the conjugated aryl additive in b) absorbing strongly from about 222 nm to about to about 310 nm is chosen from (I), (II), (III), (IV), (V), (VI) and (VII);

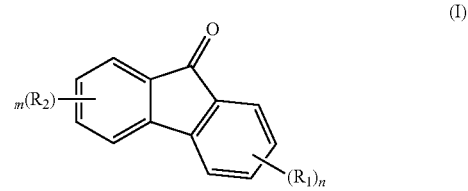

(I)

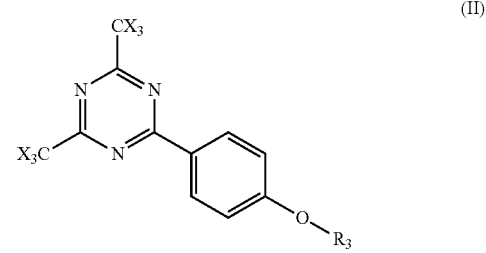

(II)

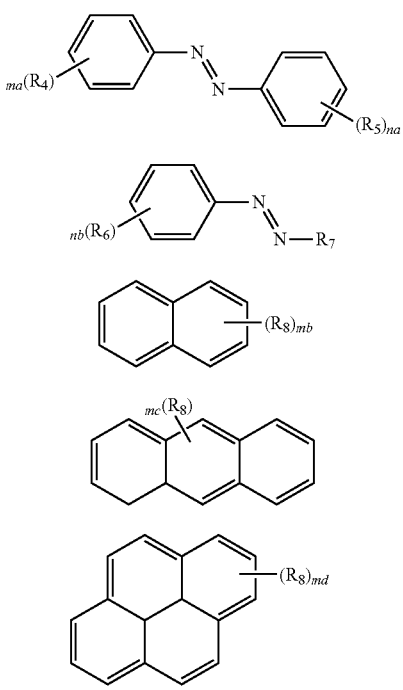

where $R_1$, $R_2$, $R_3$, $R_4$, $R_5$ and $R_6$ are independently chosen from hydrogen, an alkyl group, a alkylenefluoroalkyl group, an alkylene aryl group, and a alkyleneoxyalkyl group; $R_7$ is chosen from an alkyl group, a alkylenefluoroalkyl group, an alkylene aryl group, and an alkyleneoxyalkyl group; $R_8$ substituents are independently chosen from hydrogen, an alkyl group, a alkylenefluoroalkyl group, an alkylene aryl group, an alkyleneoxyalkyl group, a hydroxy group, a hydroxyalkylene group, and an alkoxy group; X is a halogen selected from Cl, Br or I; and further where n, na, nb, m, ma and mb are independently chosen from an integer from 1 to 4; mc is chosen from an integer from 1 to 9, and and is chosen from an integer from 1 to 10.

In another aspect of this invention the a) components imparting negative tone aqueous base developability upon broadband irradiation may be selected from composition imparting broadband UV sensitivity as described in the following patent documents U.S. Pat. Nos. 8,906,5095, 7,601,482 and 6,576,394. Each of the documents referred to above are incorporated herein by reference in its entirety, for all purposes.

In this aspect of this invention the a) components imparting negative tone aqueous base developability upon broadband irradiation may be selected from the a) the components for imparting negative tone aqueous base developable, broadband UV resist behavior are selected from the component groups (VIII), (VIV) or (X) where, Group (VIII)

In a first Embodiment of Group (VIII) it is comprised of:
a) a phenolic film forming polymeric binder resin having ring bonded hydroxy group;
b) a photoacid generator that forms an acid upon exposure to radiation, in an amount sufficient to initiate crosslinking of the film-forming binder resin;
c) a crosslinking agent that forms a carbonium ion upon exposure to the acid of b) generated by exposure to radiation, and which comprises an etherified aminoplast polymer or oligomer;
d) a second crosslinking agent that forms a carbonium ion upon exposure to the acid of b) generated by exposure to radiation, and which comprises dihydroxyalkyl-(tetra)-phenol, wherein the amount of c) and d) is an effective crosslinking amount; and
e) a photoresist solvent In another embodiment of Group (VIII) is is comprised of the following:
a) a phenolic film-forming polymeric binder resin having ring bonded hydroxyl groups;
b) a photoacid generator that forms an acid upon exposure to radiation, in an amount sufficient to initiate crosslinking of the film-forming binder resin;
c) a crosslinking agent that forms a carbonium ion upon exposure to the acid from step b) generated by exposure to radiation, and which comprises an etherified aminoplast polymer or oligomer;
d) a second crosslinking agent that forms a carbonium ion upon exposure to the acid from step b) generated by exposure to radiation, and which comprises either: 1) a hydroxy substituted- or 2) a hydroxy $C_1$-$C_4$ alkyl substituted-$C_1$-$C_{12}$ alkyl phenol, wherein the total amount of the crosslinking agents from steps c) and d) is an effective crosslinking amount; and
e) a photoresist solvent.

a) Group (VIII) Resin Binders

In another embodiment of Group (VIII), the phenolic film-forming polymeric binder resins utilized in the above described embodiments are preferably a hydroxyaromatic polymers that are soluble in an alkaline medium such as an aqueous alkaline developer, but insoluble in water. These binder resins are capable of undergoing crosslinking in the presence of a crosslinking agent. The binder resins are chosen so that the photoresist compositions of the present invention are soluble in alkaline medium, such as an aqueous alkaline developer, before being crosslinked. However, these compositions then become insoluble in such alkaline medium after crosslinking.

Preferred binder resins in a type VIII component may comprise a novolak, preferably derived from a substituted phenol such as ortho-cresol; meta-cresol; para-cresol; 2,4-xylenol; 2,5-xylenol; 3,4-xylenol, 3,5-xylenol, thymol and mixtures thereof, that has been condensed with an aldehyde such as formaldehyde. The binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a novolak/poly(vinyl phenol) copolymer.

b) Group (VIII) Photoacid Generator

The photoacid generator, upon exposure broadband radiation generates the amount of acid necessary to catalyze the crosslinking of the polymeric binder resin in the photoresist composition. This provides the final differences in solubility between the exposed and unexposed areas of the photoresist film on the substrate. The preferred photo-acid generator is a radiation sensitive oxime sulfonate sensitive to broadband radiation, such as disclosed in U.S. Pat. Nos. 4,540,598 and 5,627,011. As the photoresist of type VIII, as a component in the current inventive composition for cold laser ablation, is exposed to broadband radiation, the oxime sulfonate PAG generates acid, so that crosslinking takes place during the post exposure baking process, in which the exposed areas of the photoresist composition become insoluble in the customary alkaline medium, such as an aqueous alkaline developer.

Photoacid generators may have different chemical compositions. For example, without limitation, suitable photoacid generators may be onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, nitrobenzylsulfonate derivatives, sulfonic acid ester derivatives, imidoyl sulfonate derivatives, halogenated triazine compounds, equivalents thereof or combinations thereof.

Onium salt photoacid generators may comprise, without limitation, alkyl sulfonate anions, substituted and unsubstituted aryl sulfonate anions, fluoroalkyl sulfonate anions, fluoarylalkyl sulfonate anions, fluorinated arylalkyl sulfonate anions, hexafluorophosphate anions, hexafluoroarsenate anions, hexafluoroantimonate anions, tetrafluoroborate anions, equivalents thereof or combinations thereof. Specifically, without limitation suitable photoacid generators may include triphenylsulfonium trifluoromethanesulfonate, triphenylsulfonium nonafluoro-n-butanesulfonate, triphenylsulfonium perfluoro-n-octanesulfonate, and triphenylsulfonium 2-(bicyclo[2.2.1]heptan-2-yl)-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-(bicyclo[2.2.1]heptan-2-yl)-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, and 4-methanesulfonylphenyldiphenylsulfonium 2-(bicyclo[2.2.1]heptan-2-yl)-1,1,2,2-tetrafluoroethanesulfonate, diphenyliodonium trifluoromethanesulfonate, diphenyliodonium nonafluoro-n-butanesulfonate, diphenyliodonium perfluoro-n-octanesulfonate, diphenyliodonium 2-(bicyclo[2.2.1]heptan-2-yl)-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]heptan-2-yl)-1,1,2,2-tetrafluoroethanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-(bicyclo[2.2.1]heptan-2-yl)-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]heptan-2-yl)-1,1,2,2-tetrafluoroethanesulfonate N-(trifluoromethanesulfonyloxy)bicyclo[2.2.1]hept-5-ene-2,3-dicarboximide, N-(nonafluoro-n-butanesulfonyloxy)bicyclo[2.2.1]hept-5-ene-2,3-dicarboximide, N-(perfluoro-n-octanesulfonyloxy)bicyclo[2.2.1]hept-5-ene-2,3-dicarboximide, N-[2-(bicyclo[2.2.1]heptan-2-yl)-1,1,2,2-tetrafluoroethanesulfonyloxy]bicyclo[2.2.1]hept-5-ene-2,3-dicarboximide, N-[2-(tetracyclo[4.4.0.12,5.17,10] dodecan-3-yl)-1,1-difluoroethanesulfonyloxy]bicyclo[2.2.1]hept-5-ene-2,3-dicarboximide, 1,3-dioxoisoindolin-2-yl trifluoromethanesulfonate, 1,3-dioxoisoindolin-2-yl nonafluoro-n-butane sulfonate, 1,3-dioxoisoindolin-2-yl perfluoro-n-octane sulfonate, 3-dioxoisoindolin-2-yl 2-(bicyclo[2.2.1]heptan-2-yl)-1,1,2,2-tetrafluoroethanesulfonate, 3-dioxoisoindolin-2-yl N-[2-(tetracyclo[4.4.0.12,5.17,10] dodecan-3-yl)-1,1-difluoroethanesulfonate, 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, or 1,3-dioxo-1H-benzo[de]isoquinolin-2(3H)-yl N-[2-(tetracyclo[4.4.0.12,5.17,10] dodecan-3-yl)-1,1-difluoroethanesulfonate, (E)-2-(4-methoxystyryl)-4,6-bis(trichloromethyl)-1,3,5-triazine, 2-(Methoxyphenyl)-4,6-bis(trichloromethyl)-s-triazine, 2-[2-(Furan-2-yl)ethenyl]-4,6-bis(trichloromethyl)-s-triazine, 2-[2-(5-methylfuran-2-yl)ethenyl]-4,6-bis(trichloromethyl)-s-triazine, 2-[2-(3,4-Dimethoxyphenyl)ethenyl]-4,6-bis(trichloromethyl)-s-triazine, equivalents thereof or combinations thereof. Suitable photoacid generators may also include onium salts comprising anions and cations in combinations not shown supra.

c) Group (VIII) Crosslinkers Aminoplast

The etherified aminoplast crosslinking agent comprises an organic oligomer or polymer that provides a carbonium ion upon and serves to crosslink the film-forming binder resin in the presence of an acid generated by radiation, preferably imaging radiation. This renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Preferred amino oligomers or polymers are aminoplasts obtained by the reaction of an amine, such as urea, melamine, or glycolurea with an aldehyde, such as formaldehyde. Such suitable aminoplasts include urea-formaldehyde, melamine-formaldehyde, benzoguanamine-formaldehyde, and gylcoluril-formaldehyde resins, and combinations of any of these. A particularly preferred am inoplast is hexa(methoxymethyl) melamine oligomer.

d) Group (VIII) Crosslinkers Hydroxy-Substituted Alkyl Phenol

The hydroxy-substituted alkyl phenol crosslinking agent comprises an organic polymer that provides a carbonium ion and also serves to crosslink the film-forming binder resin in the presence of an acid generated by radiation. This renders the binder resin insoluble in an alkaline medium, in the exposed areas. Such crosslinking agents include mono- and di-hydroxy-substituted phenols such as a dialkylol cresol, e.g. a dialkylol- (e.g. dimethylol-) para-cresol. Preferred dialkylol cresols comprise mono- or di-hydroxy $C_1$-$C_4$ alkyl substituted (mono-, di-, tri- or tetra-$C_1$-$C_{12}$ alkyl) phenol, such as a dihydroxyalkyl-(tetra-alkyl)-phenol. Particularly preferred cross-linking agents are the 2,6-dihydroxyalkyl-4-(tetra-alkyl) phenols, such as 2,6-dihydroxymethyl-4-(1,1,3,3-tetramethylbutyl) phenol.

e) Group (VIII) Solvents

Suitable solvents for type VIII components and the conjugated aryl additive absorbing ultraviolet radiation strongly from about 222 nm to about to about 310 nm may include propylene glycol mono-alkyl ether, propylene glycol alkyl (e.g. methyl) ether acetate, 2-heptanone, 3-methoxy-3-methyl butanol, butyl acetate, anisole, xylene, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, 2-heptanone or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate, or mixtures of one or more of these. The photoresist solvent(s) may be present in the overall photoresist composition in an amount of up to 95% by weight of the solids in the composition. Solvents, of course, are substantially removed after coating of the photoresist solution on a substrate and subsequent drying.

As a non limiting Example in the novel laser ablation compositions comprised of component VIII concentration of the phenolic film forming polymeric binder resin can range from about 30 weight % by total solids of the solution to about 50 to 80 weight % by solids, the concentration of the photoacid generator can range from about 1 weight % by solids to about 8 weight % by solids, the concentration of the Crosslinkers Aminoplast can range from about 10 weight % by solids to about 40 weight % by solids, the Crosslinkers hydroxy-substituted alkyl phenol can range from about 1 weight % by solids to about 6 weight % by solids, and the concentration of the conjugated aryl additive absorbing ultraviolet radiation strongly from about 222 nm to about to about 310 nm ranges from about 0.1 to 10 weight %. Solvents, of course, are substantially removed after coating of the novel laser ablation solution on a substrate and subsequent drying.

Group (VIV)

In one embodiment of the type (VIV) component needed for imparting negative tone resist behavior in the novel compositions capable of cold Excimer laser ablation of this invention, this component is comprised of the following:

a-1) at least one alkali-soluble polymer where the polymer comprises a least one unit of structure (VIVa)

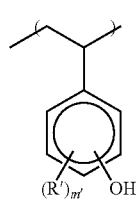

(VIVa)

where R' is selected independently from hydroxy (C$_1$-C$_4$) alkyl, chloride, bromine and m' is an integer from 1 to 4;

b-1) at least one cross-linker monomer of structure VIVb;

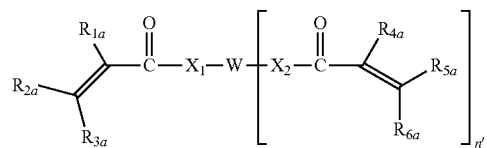

(VIVb)

where, W is a multivalent linking group, R$_{1a}$ to R$_{6a}$ are independently selected from hydrogen, hydroxy, (C1-C20) alkyl and chlorine, X$_1$ and X$_2$ are independently oxygen and n' is an integer equal to or greater than 1; and c-1) at least on photoinitiator, and further where the monomer of structure 4 comprises an acid-cleavable group and the alkali soluble polymer further comprises at least one acid-cleavelable group d-1) a photoresist solvent In another embodiment of the group (VIV) component it is comprised of the following:

a-1) An alkali soluble polymer which comprises at least one unit of structure 1, referred to in the present application as the unit comprising a phenolic group derived from the hydroxystyrene monomer,

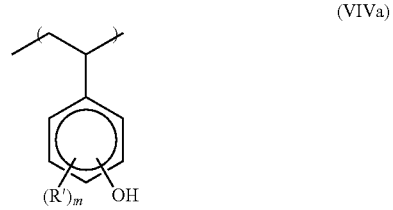

(VIVa)

where, R' is selected independently from hydrogen, (C$_1$-C$_4$) alkyl, chlorine, bromine and m is an integer from 1 to 4. The alkali soluble polymer of the negative photoresist of the present invention may be synthesized from at least one substituted or unsubstituted hydroxystyrene monomer. The hydroxystyrene monomer may be 3-hydroxystyrene or 4-hydroxystyrene. The hydroxystyrene monomer may be also selected from 3-methyl-4-hydroxystyrene, 3,5-dimethyl-4-hydroxystyrene, or 3,5-dibromo-4-hydroxystyrene. The polymer may be a homopolymer comprising the unit of structure VIVa, or a copolymer comprising the unit of structure VIVa and a unit derived from at least one other monomer unit containing an unsaturated bond. Polymers that comprise two or more types of monomeric units may be employed in the present invention, for example forming a terpolymer or a tetrapolymer. The comonomeric unit may be of structure (VIVc),

(VIVc)

where, R" is independently selected from hydrogen, (C$_1$-C$_4$)alkyl, and R$_{3c}$ is a substituted or unsubstituted aromatic group, hydrogen, substituted or unsubstituted alicyclic group, linear or branched aliphatic group containing 1 to 20 carbon atoms. R$_8$ can further comprise hetero atoms, such as those chosen from oxygen, nitrogen and halogen (such as fluorine, chlorine and bromine) atoms to form groups such as alcohol, ether, ester, amine, amide, pendant halide groups or urethane. R$_8$ may be exemplified by groups such as substituted and unsubstituted phenyl; esters; aralkyl; alkyl ethers; linear and branched alkyls, such as methyl, ethyl, propyl, isopropyl, butyl, t-butyl, pentyl, hexyl and the like; cycloalkyls, such as cyclohexyl, cycloheptyl, and the like; bicycloalkyls, such as bicyclohexyl; adamantyls or cyano, amide, acetate, propionate, pyrrolidone, carbazole, and halide (fluoride, chloride and bromide), The comonomeric unit in the polymer may be further described by structure (VIVd),

where R" is independently selected from hydrogen and ($C_1$-$C_4$)alkyl. $R_9$ is a substituted or unsubstituted aromatic group, substituted or unsubstituted alicyclic group, linear or branched aliphatic group containing 1 to 20 carbon atoms and hydrogen. $R_9$ can further comprise hetero atoms such as those chosen from oxygen, nitrogen and halogen atoms to form groups such as alcohol, ether, ester, amine, amide or urethane. $R_9$ may be exemplified by groups such as substituted and unsubstituted phenyl; esters; aralkyl; alkyl ethers; linear and branched alkyls, such as methyl, ethyl, propyl, isopropyl, butyl, t-butyl, pentyl, hexyl and the like; cycloalkyls, such as cyclohexyl, cycloheptyl, and the like; bicycloalkyls, such as bicyclohexyl; adamantyls.

The alkali soluble polymer may comprise an acid cleavable (labile) bond, which in the presence of an acid makes the polymer even more readily soluble in an aqueous alkali developer or a stripper. The acid may be generated thermally and/or photochemically. The acid cleavable bond, preferably comprises an acid cleavable C(O) OC, C—O—C or C—O—Si bond. Examples of acid cleavable groups usable herein include acetal or ketal groups formed from alkyl or cycloalkyl vinyl ethers, silyl ethers formed from suitable trimethylsilyl or t-butyl(dimethyl)silyl precursors, and carboxylates formed from t-butyl acetate, amyl acetate, 1-alkylcycloalkyl acetate, or 1-alkyladamantyl acetate precursors. Also useful are groups such as (tert-butoxycarbonyl)methyl and its ($C_1$-$C_6$) alkyl analogs. The acid labile groups may be pendant from the polymer backbone or pendant from groups attached to the polymer backbone. The acid cleavable group may be formed by partially capping the hydroxystyrene monomeric unit with a compound containing the acid cleavable group and/or be incorporated in the comonomer.

The comonomer is one capable of being polymerized with the hydroxystyrene monomer forming the unit of structure (VIVa) in the polymer, and may be exemplified by comonomers such as styrene, vinylnaphthalene, 3- or 4-acetoxystyrene, (meth)acrylic acid, (meth) acrylonitrile, methyl (meth) acrylate, t-butyl (meth)acrylate, 1-methyl-cyclopentyl (meth)acrylate, 1-methyl-cyclohexyl (meth)acrylate, 2-methyl-adamantyl-2-(meth)acrylate, 2-ethyl-adamantyl-2-(meth)acrylate, 2-butyl-adamantyl-2-(meth)acrylate, substituted or unsubstituted hydroxystyrene with an acid cleavable group, an ethylenic comonomer with an acid cleavable group, and norbornene derivative with an acid cleavable group.

The polymer may be prepared from the corresponding monomers by any suitable conventional polymerization process which react an ethylenically unsaturated group. Such processes include, but are not limited to free radical polymerization or ionic polymerization. Such processes are typically run in solvent or solvent mixture using a catalyst or initiator. Initiators can be chosen based on the temperature to be employed in the polymerization. Examples of suitable free radical initiators are benzoyl peroxide, 2,2'-azobisisobutyronitrile and lauroyl peroxide. Optionally, a chain transfer agent may be included, such as 1-dodecanethiol.

The monomeric unit of structure VIVa may range from about 10 mole % to about 100 mole % in one embodiment, from about 30 mole % to about 80 mole % in another embodiment, and from about 40 mole % to about 70 mole % in another embodiment.

The alkali soluble polymer of the present invention has a weight average molecular weight ranging from about 2,000 to about 100,000, preferably from about 3,000 to about 50,000, and more preferably from about 5,000 to about 30,000. The polymer is present in the formulation at levels ranging from about 5 to about 75 weight %, preferably from about 10 to about 70 weight % by total solids of the photoresist.

b-1) Group (VIV) Photopolymerizable Cross-Linker Monomer

The negative photoresist composition of Type VIV useful as a component in the present invention also comprises a photopolymerizable monomer, which is capable of polymerizing in the presence of a photoinitiator and contains at least two ethylenic unsaturated bonds. The photopolymerizable monomer is a (meth)acrylate and can be illustrated by structure VIVb,

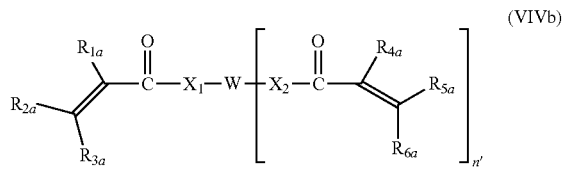

where, W is a multivalent linking group, $R_{1a}$ to $R_{6a}$ are independently selected from hydrogen, hydroxy, ($C_1$-$C_{20}$) alkyl and chlorine, $X_1$ and $X_2$ are independently oxygen or N—$R_{7a}$, where $R_{7a}$ is hydrogen or ($C_1$-$C_{20}$) alkyl, and n is an integer equal to or greater than 1. In one embodiment $R_{7a}$ is hydrogen or ($C_1$-$C_4$) alkyl. In one embodiment $X_1$ and $X_2$ are oxygen. W is a multivalent linking group, where W can be a small molecular moiety or a polymer. Examples of multivalent W are a divalent, trivalent, tetravalent, pentavalent, hexavalent and heptavalent moiety, and n can range from 1 to about 7. The monomer may also be a polymer with pendant vinyl groups, such as the acrylate groups in structure VIVb, where W is a polymer. W can further be a linear or branched alkylene group containing 1-20 carbon atoms; the alkylene group may additionally contain one or more pendant hydroxy groups, alkyne bonds, ester groups, ether groups, amide groups or other acceptable organic groups. W may be ($C_2$-$C_3$) alkoxylated ($C_1$-$C_{20}$) alkylene. In one embodiment W is a hydrocarbon moiety containing only carbon and hydrogen atoms.

The above-mentioned polymerizable monomer is a polymerizable compound having at least two ethylenic unsaturated double bonds in a molecule, such as alkyl acrylates, hydroxyalkyl acrylates, alkyl methacrylates or hydroxyalkyl methacrylates. Examples of the polymerizable compound are not particularly limited and can be appropriately selected depending on the purposes, and include acrylic acid derivatives such as acrylic acid esters and methacrylic acid derivatives such as methacrylic acid esters. The polymerizable monomer may have a low molecular weight (monomer property) or a high molecular weight (oligomer or polymer property).

Examples of the polymerizable monomer containing two or more double bonds include unsaturated esters, as shown in Structure VIVb. The polymerizable monomer may be derived from the reaction of unsaturated carboxylic acids or unsaturated acid chlorides with compounds containing epoxy groups, more than 2 hydroxy groups (polyols), two or more amino groups (polyamines), mixture of hydroxyl and amino (amino alcohol) groups or mixtures of these groups. Examples of the unsaturated carboxylic acids include unsaturated fatty acids such as acrylic acid, methacrylic acid, crotonic acid, itaconic acid, cinnamic acid, linoleic acid and oleic acid. Among these, acrylic acid and methacrylic acid are preferable. The equivalent acid chlorides to the above mentioned unsaturated carboxylic acids may also be used. Suitable polyols are aromatic and particularly aliphatic and alicyclic polyols. Examples of the aliphatic and alicyclic polyols include alkylene diols preferably having 2 to 12 carbon atoms such as ethylene glycol, 1,2- or 1,3-propenediol, 1,2-, 1,3- or 1,4-butanediol, pentanediol, hexanediol, 2,5-hexanediol, octanediol, dodecanediol, diethylene glycol, and triethylene glycol; polyethylene glycol having 200 to 1,500 molecular weight, 1,3-cyclopentanediol, 1,2-, 1,3-, or 1,4-cyclohexanediol, 1,4-dihydroxymethylcyclohexane, glycerol, tris(β-hydroxyethyl) amine, trimethylolethane, trimethylolpropane, pentaerythritol, dipentaerythritol and sorbitol. Aromatic polyols can be bisphenol A or its analogs.

Examples of amines are alkylene amines, and include 1,2-ethylene diamine, 1,2- or 1,3-propylene diamine, diaminocyclohexane, 1,3-cyclohexanebismethylamine, 2,2-ethylenedioxybisethylamine and the like. Examples of amino alcohols include 3-amino-1-propanol and the like. Examples of epoxy compounds include 1,2,7,8-diepoxyethane and the like.

Examples of the multi-unsaturated compound of a relatively high molecular weight (oligomer/polymer property) include unsaturated polyester resins generally produced from maleic acid, phthalic acid, and one or more diols and having a molecular weight of about 500 to 3,000.

Polyols can be partially or completely esterified with one kind of carboxylic acid or different types of unsaturated carboxylic acids and in the partially esterified compounds, free hydroxyl may be modified and, for example, esterified with other carboxylic acids.

Examples of the polymerizable monomer are without limitation as follows: 4,4'-bis(2-acryloyloxyethoxy)diphenyl propane, vinyl acrylate, trimethylolpropane triacrylate, trimethylolethane triacrylate, trimethylolpropane trimethacrylate, trimethylolethane trimethacrylate, tetram ethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate, and methacrylate, glycerol diacrylate, and triacrylate, 1,4-cyclohexane diacrylate, bisacrylate and bismethacrylate of polyethylene glycol with a molecular weight of 200 to 1,500 and their mixtures.

Further examples for polymerizable monomers include 1,2-ethanediol diacrylate, 1,2-propanediol diacrylate, 1,4-butanediol diacrylate, hexan-1,6-diol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol A diglycidylether diacrylate, ethoxylated bisphenol A diglycidylether diacrylate, polyethylene glycol diacrylate, trimethylolpropane triacrylate, ethoxylated trimethylolpropane triacrylate, propoxylated trimethylolpropane triacrylate, propoxylated glycerine triacrylate, tris(2-acryloyloxy ethyl) isocyanurate, pentaerythritol triacrylate, ethoxylated pentaerythritol triacrylate, pentaerythritol tetraacrylate, ethoxylated pentaerythritol tetraacrylate, di(trimethylolpropane) tetraacrylate, di(pentaerythritol) pentaacrylate, di(pentaerythritol) hexaacrylate and oligomers and polymers containing acrylate groups obtained by conversion of poly epoxides with acrylic acid (epoxy acrylate) or by conversion of polyester polyol with acrylic acid or monomeric alkyl acrylates (polyester acrylates) or by conversion of isocyanate prepolymers with 2-hydroxyethyl acrylate ((polyurea acrylate) and acrylated soy bean oil and acrylated silicone oil.

The photopolymerizable monomer may also comprise acid cleavable groups which in the presence of an acid will cleave to form compounds which increase the aqueous alkaline solubility of the coating of the present invention. Such acid cleavable groups may be C(O)—OC, C—O—C or C—O—Si groups within the monomer. Generally known acid cleavable groups may be used. In one embodiment the acid cleavable group comprises a tertiary carbon atom adjacent to an oxygen atom or nitrogen atom ($X_1$ and/or $X_2$) of the monomer of structure 4, and the tertiary carbon atom has ($C_1$-$C_5$) alkyl groups attached to this carbon atom, that is the monomer comprises a tertiary alkyl ester. Thus, W is a ($C_1$-$C_{20}$) alkylene chain with tertiary carbon atoms at the end of the chain linking to the acrylate end groups, where 2,5-dimethyl-2-5-hexene is an example of the linking group, W. Thus W can be $C(R_{10}R_{11})$—($C_1$-$C_{20}$)alkylene-C$(R_{12}R_{13})$, where $R_{10}$, $R_{11}$, $R_{12}$ and $R_{13}$ are independently selected from ($C_1$-$C_5$) alkyl groups. W may additionally contain acid cleavable groups such C(O)—OC, C—O—C or C—O—Si groups within the moiety. The acid may be generated thermally and/or photochemically using thermal acid generators and/or photoacid generators.

c-1) Group (VIV) Photoinitiator

In the photopolymerizable composition of component (VIV), the composition contains at least one broadband photoinitiator or broadband photoradical generating agent capable of generating a radical upon exposure to a light source. Any photoiniator capable of generating a radical upon exposure to radiation may be used. One or more photoinitiators may be selected from those capable of starting polymerization of the polymerizable compound contained in the composition of the present invention and to be used as the above-mentioned photoinitiator.

Examples of the above-mentioned broadband photoinitiator include without limitation benzophenone, camphorquinone, 4,4-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorene, acridone, bisacylphosphine oxides such as bis(2,4,6-trimethylbenzoyl)-phenylphosphine oxide and the like, α-hydroxy or α-aminoacetophenones, α-hydroxycycloalkylphenylketones, and aromatic ketones such as dialkoxyacetophenone; benzoin and benzoin ethers such as benzoinmethyl ether, benzoinethyl ether, benzoinpropyl ether, benzoinphenyl ether, and the like; 2,4,6-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer; and lophine dimer compounds described in U.S. Pat. Nos. 3,784, 557, 4,252,887, 4,311,783, 4,459,349, 4,410,621, 4,622,286 and the like: polyhalogen compounds such as tetrabromocarbon, phenyltribromomethylsulfone, phenyltrichloromethyl ketone and the like; and compounds described in U.S. Pat. No. 3,615,455; 5-triazine derivatives (trihalomethyl compounds) having trihalogen-substituted methyl, such as 2,4,6-tris(trichloromethyl)-S-triazine, 2-methoxy-4,6-bis(trichloromethyl)-S-triazine, 2-am ino-4,6-bis(trichloromethyl)-S-triazine, 2-(P-methoxystyryl-4,6-bis(trichloromethyl)-S-triazine and the like; organic peroxides, such as methyl ethyl ketone peroxide, cyclohexanone peroxide, 3,3, 5-trimethylcyclohexanone peroxide, benzoyl peroxide, di-tert-butyl peroxyisophthalate, 2,5-dimethyl-2,5-di(benzoylperoxy)hexane, tert-butyl peroxybenzoate, a,a'-bis(tert-butylperoxyisopropyl)benzene, dicumyl peroxide, 3,3',4,4'-tetra-(tert-butylperoxycarbonyl)benzophenone and the like; azinium compounds; organic boron compounds; phenylglyoxalic acid esters such as phenylglyoxalic methyl ester; titanocenes such as bis($\eta^5$-2,4-cyclopentadien-1-yl)-bis(2,6-difluoro-3-(1H-pyrrol-1-yl)-phenyl)titanium and the like; onium salt compounds such as diaryliodonium salts and triarylsulfonium salts obtained by using diphenyliodonium, 4,4'-dichlorodiphenyliodonium, 4,4'-dimethoxydiphenyliodonium, 4,4'-di-t-butylidiphenyliodonium, 4-methyl-4'-isopropyl-diphenyliodonium, or 3,3'-dinitrodiphenyliodonium in combination with chloride, bromide, tetrafluoroborate, hexafluorophosphate, hexafluoroarsenate, hexafluoroantimonate, tetrakis(pentafluorophenyl) borate, or trifluoromethanesulfonic acid;

Preferred broadband photoinitiators for resist type (VIV) are those available under the trade designations IRGACURE and DAROCUR from Ciba Speciality Chemical Corp., Tarrytown, N.Y. and include 1-hydroxy cyclohexyl phenyl ketone (IRGACURE 184), 2,2-dimethoxy-1,2-diphenylethan-1-one (IRGACURE 651), bis(2,4,6-trimethylbenzoyl) phenylphosphineoxide (IRGACURE 819), 1-[4-(2-hydroxyethoxy)phenyl]-2-hydroxy-2-methyl-1-propane-1-one (IRGACURE 2959), 2-benzyl-2-dimethylamino-1-(4-morpholinophenyl)butanone (IRGACURE 369), 2-methyl-1-[4-(methylthio)phenyl]-2-morpholinopropan-1-one (IRGACURE 907), and 2-hydroxy-2-methyl-1-phenyl propan-1-one (DAROCUR 1173). Particularly preferred photoinitiators are IRGACURE 819, 369 and 907.

Moreover, as the above-mentioned broadband photoinitiator, two or more kinds of those exemplified compounds may be used in combination. Examples thereof include the following: any combinations of acrylphosphine oxides, alpha-hydroxy ketones and alpha-amino ketones.

The combination of 2-methyl-1[4-(methylthio)phenyl]-2-morpholinopropan-1-one (Irgacure 907) and bis(2,4,6-trimethylbenzoyl)-phenylphosphineoxide (Irgacure 819) is used in one embodiment.

The photopolymerizable composition of the present invention may further contain broadband sensitizers, such as isopropyl thioxanthone and 3-keto cumarine, which absorb radiation at one particular wavelength and transfer energy to the photosensitive compound at a different wavelength.

d-1)) Group (VIV) Additional Components
d-1a)—Group (VIV) Accelerators

In addition the photopolymerizable composition of type (VIV) as described above may in addition to component a-1), b-1) c-1) may also contain so called accelerators, such as tributylamine, N-methyl diethanolamine, N-butyl diethanolamine, triethanolamine, piperidine, morpholine, piperazine, and acrylated amines, obtained from 1,6-hexanediol diacrylate and ethanolamine tributylamine, N-methyl diethanolamine, N-butyl diethanolamine, triethanolamine, piperidine, morpholine, piperazine, and acrylated amines, obtained from 1,6-hexanediol diacrylate and ethanolamine.

d-1b)—Group (VIV) Surfactants, Dyes, Plasticizers, Secondary Polymers

The component of type VIV one of the possible component in the present cold laser ablation invention may contain other components such as additives, surfactants, dyes, plasticizers, and other secondary polymers. Surfactants are typically compounds/polymers containing fluorine or silicon compounds which can assist in forming good uniform photoresist coatings. Certain types of dyes may be used to provide absorption of unwanted light. Plasticizers may be used, especially for thick films, to assist in flow properties of the film, such as those containing sulfur or oxygen. Examples of plasticizers are adipates, sebacates and phthalates. Surfactants and/or plasticizers may be added at concentrations ranging from about 0.1 to about 10 weight % by total weight of solids in the photoresist composition. Secondary polymers may be added to the composition of the present invention. These secondary polymers provide properties that enhance the physical and lithographic properties of the photoresist composition, such as providing scum-free development. Polymers containing hydrophilic groups are preferred. Examples of secondary polymers are unsubstituted or substituted (meth)acrylic acid containing polymers or copolymers, unsubstituted or substituted (meth)acrylate containing polymers or copolymers, unsubstituted or substituted vinyl ester containing polymers or copolymers, unsubstituted or substituted vinyl aromatic containing polymers or copolymers, (meth)acrylic acid-styrene copolymers and novolak polymers. Novolak polymers can be prepared from polymerization of phenol, cresols, di- and trimethyl-substituted-phenols, polyhydroxybenzenes, naphthols, polyhydroxynaphthols and other alkyl-substituted-polyhydroxyphenols and formaldehyde, acetaldehyde or benzaldehyde. Secondary polymers may be added at levels ranging from about 0% to about 70%, preferably from about 10% to about 40% of total solids of the photoresist.

In order to prevent inhibition of polymerization by oxygen, a waxy compound, such as polyolefins, can be added to the composition. It is believed that as a consequence of their appropriate solubility in the mixtures, they float on top of the mixture at the start of polymerization and form a thin protecting layer between atmospheric oxygen and the polymerizing mixture. Additionally, auto-oxidizing compounds like allyl ethers can be added that prevent inhibition of polymerization by oxygen in some cases.

e-1) Group (VIV) Solvents

Suitable solvents for the novel composition for Excimer ablation of this invention comprised of conjugated aryl additive absorbing ultraviolet radiation strongly from about 222 nm to about to about 310 nm and the components of type may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. These solvent in addition to dissolving the type VIV component must also dissolve the conjugated aryl additive absorbing ultraviolet radiation strongly from about 222 nm to about to about 310 nm As a non-limiting Example in the novel laser ablation compositions comprised of component VIV concentration of the polymer can range from about 10 weight % by total solids of the composition for laser ablation to about 50 (80) weight % by solids, the concentration of the monomer can range from about 10 weight % by solids to about 50 or to about 80 weight % by solids, the concentration of the photo-initiator can range from about 0.5 weight % by solids to about 20 weight % by solids, and the concentration of the conjugated aryl additive absorbing ultraviolet radiation strongly from about 222 nm to about to about 310 nm ranges from about 0.1 to 10 weight %. Solvents, of course, are substantially removed after coating of the novel laser ablation solution on a substrate and subsequent drying.

Group (X)

In one embodiment of the type (X) component needed for imparting broadband negative tone resist behavior in the novel compositions capable of cold Excimer laser ablation of this invention, this component is comprised of the following:

In another embodiment of the type (X) component needed for imparting broadband negative tone resist behavior in the novel compositions capable of cold Excimer laser ablation of this invention, this component is comprised of components a-2 to d-2 wherein a-2 is at least one polymer comprising a structure of the following formula (Xa):

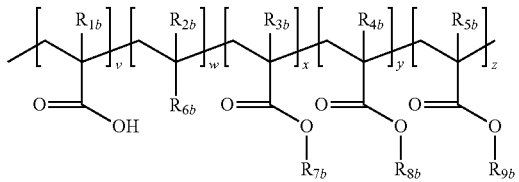

(Xa)

wherein $R_{1b}$-$R_{5b}$ is independently H, F or $CH_3$, $R_6$ is selected from a group consisting of a substituted aryl, unsubstituted aryl, substituted heteroaryl group and unsubstituted heteroaryl group, $R_{7b}$ is a substituted or unsubstituted benzyl group, $R_{8b}$ is a linear or branched $C_2$-$C_{10}$ hydroxy alkyl group or a $C_2$-$C_{10}$ hydroxy alkyl acrylate and $R_9$ is an acid cleavable group, v=10-40 mole %, w=0-35 mole %, x=0-60 mole %, y=10-60 mole % and z=0-45 mole %.

b-2) one or more free radical initiators activated by broadband radiation, c-2) one or more crosslinkable acrylated monomers capable of undergoing free radical crosslinking wherein the acrylate functionality is greater than 1, and d-2) a solvent.

In another embodiment of the above embodiments the type X composition is capable of being solubilized in aqueous alkaline developer prior to crosslinking the acrylate monomers.

In another embodiment of the above embodiments the type X compositions of the above embodiments further comprising at least one polymer comprising the reaction product of styrene and at least one acid containing monomer or maleic anhydride, said anhydride reaction product being further partially esterified with an alcohol.

In another embodiment of the above embodiments the type X compositions of the above embodiments further comprising one or more crosslinkable acrylated siloxane or acrylated silsesquioxane based monomers capable of undergoing free radical crosslinking wherein the acrylate functionality is greater than 1.

a-2) Other Embodiments of Polymer Comprising a Structure of Formula (Xa)

In one embodiment of the composition of type (X) the polymer comprising a structure (Xa) is one in which $R_{1b}$ through $R_{5b}$ are independently a methyl group, hydrogen or fluoride. $R_{1b}$ through $R_{5b}$ may be the same or different depending on the desired properties of the polymer. One of the components of the polymer contains a carboxylic acid prepared from the appropriate acrylic acid monomer, wherein $R_{1b}$ is methyl, a hydrogen atom, or a fluoride atom. $R_{6b}$ is a substituted or unsubstituted aryl group, such as, for example, phenyl, tolyl, xylyl, naphthyl, anthracyl, biphenyl, triphenyl and the like substituted with $C_1$-$C_{24}$ alkyl or alkenyl groups or other functional group as well as 5, 6 and 7 ring heterocyclic aromatic groups such as azoles, thiazoles, oxazoles, pyridine, pyridazine, and the like. $R_{7b}$ is a substituted or unsubstituted benzyl group which may be substituted with, for example, $C_1$-$C_{24}$ alkyl or alkenyl groups or other functional groups. $R_{8b}$ is a linear or branched, $C_2$-$C_{10}$ hydroxy alkyl group or a $C_2$-$C_{10}$ hydroxy alkyl acrylate such as for example, wherein the hydroxy group is attached to the second carbon in the chain such as, —$CH_2$—$CH_2$—OH, —$CH_2$—CH(OH)—$CH_3$, or —$CH_2$—CH(OH)—$CH_2$—$CH_3$ as well as wherein the hydroxy group is attached to the third carbon in the chain or other carbon. The hydroxy alkyl acrylate may be and methacrylated glycerol acrylate, —$CH_2$—CH(OH)—$CH_2$OC(O)C(=$CH_2$)$CH_3$.

In another embodiment the polymer comprising a structure (Xa) may further comprise other co-monomeric units, such as ones derived from cyclopentadienyl acrylate and campholyl acrylate. These additional co-monomeric units may be present at 0-30 mole %.

Non limiting example of the acid labile group $R_{9b}$ are for example, a t-butyl group, a tetrahydropyran-2-yl group, a tetrahydrofuran-2-yl group, a 4-methoxytetrahydropyran-4- yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group or other group that is cleaved when exposed to acid leaving behind a carboxylic acid group.

In one embodiment of this invention v in structure (Xa) is between about 10 and about 40 mole %, w is between about 0 and about 35 mole %, x is between about 0-60 mole %, y is between about 10-60 mole % and z is between about 0-45 mole %. The general formula (Xa) above is not meant to show the exact positioning of the component parts of the polymer so that the parts may exist together randomly, as well, 2 or more of the same component part may exist side-by-side in the polymer.

In accordance with the above embodiments, with reference to (Xa), an exemplary molar percentage range for v may be 10-30 mole %. A further exemplary molar percentage range for v may be 15-25 mole %. An exemplary molar percentage range for w may be 0-25 mole %. A further exemplary molar percentage range for w may be 0-20 mole %. An exemplary molar percentage range for x may be 0-50 mole %. A further exemplary molar percentage range for x, when present, may be 30-55 mole %. An exemplary molar percentage range for y may be 20-45 mole %. A further exemplary molar percentage range for y may be 25-40 mole %. An exemplary molar percentage range for z may be 0-35 mole %. A further exemplary molar percentage range for z, when present, may be 25-40 mole %. Mole percentages are not independent in that they must add to 100%.

a-2a) Other Polymer Components

The compositions may also include one or more polymers whose carboxylic acid prepared from the appropriate acrylic acid monomer, wherein $R_{1b}$ is methyl, a hydrogen atom, or a fluoride atom, is replaced by a succinic acid half ester prepared by polymerizing maleic anhydride with other selected monomers to create a polymer and then reaction of the anhydride with an alcohol to create a carboxylic acid and an ester.

The polymers of the composition of the present composition can be prepared by any of the known methods for preparing polyacrylates.

b-2) Free Radical Initiators Activated by Broadband Radiation

Component X may further contain one or more free radical initiators or initiator systems activated by broadband radiation. A single photoinitiator or a photoinitiator system containing multiple components may be used. The photoinitiator can be of a specific type, such as a halogenated-2,5cyclohexadienone, benzophenone, alkylaryl ketone or diketone type, or mixtures thereof. Any of a variety of free radical generating photoinitiators can be used in the current invention. Benzophenone derivatives such as benzophenone, bis-4,4'-dimethylam inobenzophenone (Michler's ketone), bis-4,4'-diethylaminobenzophenone (ethyl Michler's ketone), benzophenones singly or multiply substituted with other alkylamino groups, chloro, methoxy, etc. are suitable. Also substituted xanthones, thioxanthones, anthrones, and fluorenones are useful initiators, as well as alkyl, chloro, and alkoxy substituted thioxanthones. Substituted cyclohexadienones can be also be used, such as with both an alkyl and a trichloromethyl substituent in the 4 position. Useful alkylarylketone derivatives include ketaldonyl alcohols such as benzoin, pivaloin, and acyloin ethers such as benzoin alkyl ethers, benzoin aryl ethers, alphahydrocarbon substituted aromatic acyloins, benzoin dialkyl ketals, benzil, benzoin esters, O-acylated oximinoketones, and alpha-amino ketones such as alpha-aminoactophenone derivatives. Substituted or unsubstituted polynuclear quinones such as 9,10-anthroquinones, 1,4-naphthquinones, and phenanthrene quinones are also possible initiators. Tertiary amines suitable as electron and or hydrogen donors can also be used as part of the initiating system such as substituted N,N-dialkylaminobenzene derivatives and ethyl-4-(dimethylamino)benzoate. Useful diketones include biacetyl, 2,3-dibenzoyl-2-norbornene, benzoylbenzal chloride, 2,2-dibromo-2(phenylsulfonyl)propanedione, alpha-naphthyl, 2,3-bornanedione, phenylpuruvic acid and 2,4-pentanedione. Representative quinones that can be used include 4-benzoquinone, 2-benzo-quinonediazide, anthraquinone, 2-methylanthraquinone, 2,6-dimethoxyanthra-quinone, 2,4,8-trichloroanthraquinone, amino anthraquinone, 1,4-napthoquinone derivatives and phenanthrenequinones. Also useful as photoinitiators are 2,4,5-triphenylimidazolyl dimers in combination with chain transfer agents, or hydrogen donors.

c-2) Crosslinkable Acrylated Monomers Capable of Undergoing Free Radical Crosslinking wherein the Acrylate Functionality is Greater than 1

Component X may further contain one or more crosslinkable acrylated monomers capable of undergoing free radical crosslinking, wherein the acrylate functionality is greater than 1. Suitable monomers include 1,4-butanediol diacrylate, 1,5-pentanedioldiacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, glycerol triacrylate, trimethylolpropane triacrylate, pentaerythritol triacrylate, polyoxyethylated trimethylolpropane tri(meth)acrylate, polypropoxylated trimethylolpropane tri(meth) acrylate and similar compounds, 2,2-di(p-hydroxyphenyl)propane diacrylate, pentaerythritol tetraacrylate, 2,2di(p-hydroxyphenyl)propane dimethacrylate, triethylene glycol diacrylate, polyoxyethyl-2,2-di(p-hydroxyphenyl)propane dimethacrylate, bisphenol A diacrylate, di-(3-methacryloxy-2-hydroxypropyl)ether of bisphenol A, di-2-methacryloxyethyl ether of bisphenol A, di-(3-acryloxy-2-hydroxypropyl)ether of bisphenol A, di-2acryloxyethyl ether of bisphenol A, di-(3-methacryloxy-2-5 hydroxypropyl)ether of tetrachloro-bisphenol A, di-2methacryloxyethyl ether of tetrachloro-bisphenol A, di-(3methacryloxy-2-hydroxypropyl)ether of tetrabromobisphenol A, di-2-methacryloxyethyl ether of tetrabromobisphenol A, di-(3-methacryloxy-2-hydroxypropyl) ether of 1,4-butanediol, triethylene glycol dimethacrylate, trimethylolpropane trimethacrylate, ethylene glycol dimethacrylate, butylene glycol dimethacrylate, 1,3-propanediol dimethacrylate, 1,2,4-butanetriol trimethacrylate, 2,2,4trimethyl-1,3-pentanediol dimethacrylate, 1,2,4-butanetriol trimethacrylate, 2,2,4-trimethyl-1,3-pentanediol 1,5 dimethacrylate, pentaerythritol trimethacrylate, 1-phenylethylene-1,2-dimethacrylate, pentaerythritol tetramethacrylate, 1,5-pentanediol dimethacrylate, 1,4-benzenediol dimethacrylate, 1,3,5-triisopropenyl benzene and polycaprolactone diacrylate.

d-2) A Solvent

Solvents useful in embodiments of the inventive laser ablation composition containing component X are selected from the group consisting of $C_1$-$C_4$ alcohols, $C_4$-$C_8$ ethers, $C_3$-$C_6$ ketones, $C_3$-$C_6$ esters, and mixtures thereof. Examples of $C_1$-$C_4$ alcohols include methanol, ethanol, 1-propanol, and 2-propanol. Examples of $C_4$-$C_8$ ethers include diethyl ether, dipropyl ether, dibutyl ether and tetrahydrofuran. Examples of $C_3$-$C_6$ ketones include acetone, methyl ethyl ketone and cyclohexanone. Examples of $C_3$-$C_6$ esters include methyl acetate, ethyl acetate and n-butyl acetate.

Examples of suitable organic solvents for include ketones such as acetone, methyl ethyl ketone, cyclohexanone, methyl isoamyl ketone, methyl amyl ketone, and the like, polyhydric alcohols and derivatives thereof such as monomethyl, monoethyl, monopropyl, monobutyl and monophenyl ethers of ethyleneglycol, ethyleneglycol monoacetate, diethyleneglycol, diethyleneglycol monoacetate, propyleneglycol, propyleneglycol monoacetate, dipropyleneglycol or dipropyleneglycol monoacetate and the like, cyclic ethers such as dioxane, tetrahydrofuran and the like, esters such as methyl lactate, ethyl lactate, methyl acetate, ethyl acetate, butyl acetate and the like and solvents having aromatic groups such as anisole, ethyl benzene, xylenes, chlorobenzene, toluene and the like. Examples are propyleneglycol monomethyl ether acetate, propyleneglycol monomethyl ether and ethyl lactate.

Solvents having one or more polar functional groups such as hydroxyl, ether, amide, ester, ketone, and carbonate, for example, two functional groups, which may be the same or different, such as two hydroxyl groups or one hydroxyl group and one ether group, including, for example, polyol, glycol ether, diacetone alcohol, 2-pyrrolidinone, N-methylpyrrolidinone, ethyl lactate, propylene carbonate, 1,3-dimethyl-2-imidazolidindione, and alkyl esters, and any combination thereof can be used.

For example, polyols such as polyethylene glycol, polypropylene glycol, poly(ethylene-co-propylene glycol), polyvinyl alcohol, trimethylol propane, ethylene glycol, glycerin, diethylene glycol, triethylene glycol, tripropylene glycol, tetraethylene glycol, pentaethylene glycol, 1,2-propylene glycol, 1,3-propanediol, butylene glycol, triethylene glycol, 1,2,6-hexanetriol, thiodiglycol, hexylene glycol, bis-2-hydroxyethyl ether, 1,4-butanediol, 1,2-butenediol, 1,4-butenediol, 1,3-butenediol, 1,5-pentanediol, 2,4-pentanediol, 2,4-heptanediol, 1,8-octanediol, 1,10-decanediol, 1,12-dodecanediol, 1,4-cyclohexanediol, 1,4-cyclohexanedimethanol, 1,2-bis(hydroxymethyl)cyclohexane, 1,2-bis(hydroxyethyl)-cyclohexane, 3-methyl-1,5-pentanediol, 2,2,4-trimethyl-1,3-pentanediol, neopentyl glycol, pentaerythritol, sorbitol, mannitol, and any combination thereof, including polyethylene glycol, trimethylol propane, ethylene glycol, glycerin, diethylene glycol, tripropylene glycol, and any combination thereof, can be used.

For example, glycol ethers such as ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, propylene glycol n-propyl ether, propylene glycol t-butyl ether, propylene glycol n-butyl ether, dipropylene glycol methyl ether, dipropylene glycol n-propyl ether, dipropylene glycol t-butyl ether, dipropylene glycol n-butyl ether, tripropylene glycol n-propyl ether, tripropylene glycol t-butyl ether, tripropylene glycol n-butyl ether, ethyl cellosolve, methyl cellosolve, polyethylene glycol monomethyl ether, polypropylene glycol monomethyl ether, methoxytriglycol, ethoxytriglycol, butoxytriglycol, 1-butoxyethoxy-2-propanol, and any combination thereof, including ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, and any combination thereof, can be used.

These organic solvents can be used either singly or in admixture according to need.

The novel laser ablation composition comprised of components VIII, VIV or X when coated as a film on a substrate are either inherently soluble in aqueous base developer prior to exposure to broadband radiation or become soluble in unexposed area after a baking step due to cleavage of acid labile protecting groups during a baking step induced by acid originating from a thermal acid generator. In either case, upon exposure to broadband radiation exposed areas of the film become insoluble in aqueous base due to crosslinking. Typical aqueous alkaline developers including hydroxides, for example tetra ($C_1$-$C_4$ alkyl)ammonium hydroxide, choline hydroxide, lithium hydroxide, sodium hydroxide, or potassium hydroxide, carbonates, bicarbonates, amines and other basic materials. In some cases and some applications solvent developers well known in the industry may be used.

The currently disclosed novel laser ablation composition containing VIII, VIV and X may further contain polymers useful for their particular properties. For example, polymers with high acid values can be added as additional polymer components to aid in the development stage as well as the stripping stage, such as, styrene-co-maleic anhydride-half ester, wherein the ester group may impart certain properties to the composition.

The currently disclosed novel laser ablation composition containing component X may also contain as additional components silicon-based materials, capable of reacting with photo-generated free radicals may also be used. These materials include, for example, silsesquioxane full or partial cage materials, as well as ladder materials, which can be included to impart improved toughness, thermal stability and other desirable properties to the composition and the final relief image. Acrylates, methacrylates, and vinyl groups may be attached to the silicon material to impart curability. An example is octa-acrylo-silsesquioxane type of materials.

Another embodiment of the novel composition as previously described is an embodiment where the wherein the conjugated aryl additive in component b) has structure (I), and further where $R_2$ and $R_1$ are independently chosen from hydrogen or an alkyl group.

Another embodiment of the novel composition as previously described is an embodiment where the where the conjugated aryl additive in component b) has structure (II), and further where $R_3$ is an alkyl group and X is Cl.

Another embodiment of the novel composition as previously described is an embodiment where the where the conjugated aryl additive in component b) has structure (V), and where at least one $R_8$ is independently chosen from an alkoxy group, a hydroxyalkylene, or a hydroxy group.

Another embodiment of the novel composition as previously described is an embodiment where the where the conjugated aryl additive has structure (VI), and where at least one $R_8$ is independently chosen from an alkoxy group, a hydroxyalkylene, or a hydroxy group.

Another aspect of this novel composition is where the component a) group is selected from (VIII), (VIV) or (X) and where further the conjugated aryl additive in component a), the conjugated aryl additive, is chosen from (I), (II).

Another aspect of this novel composition is where the component a) group is selected from (VIII), (VIV) or (X) and where in the component b), the conjugated aryl additive, is (I).

Another aspect of this novel composition is where the component a) group is elected from (VIII), (VIV) or (X) and where further in the component b), the conjugated aryl additive, is (II).

Another aspect of this novel composition is where component a) group is selected from (VIII) and where the component b), the conjugated aryl additive, is selected from (I) or (II).

Another aspect of this novel composition is where component a) group is selected from (VIII) and where further the component b) the conjugated aryl additive is (I).

Another aspect of this novel composition is where component a) group is selected from (VIII) and where further in the component b), the conjugated aryl additive, is (II).

Another aspect of this novel composition is where component a) group is selected from (VIV), and where further in the component b), the conjugated aryl additive, is (I) or (II).

Another aspect of this novel composition is where component a) group is selected from (VIV), where further in the component b), the conjugated aryl additive, is (I).

Another aspect of this novel composition is where component a) group is selected from (VIV) where further in the component b), the conjugated aryl additive, is (II).

Another aspect of this novel composition is where is where component a) group is selected from (X), where further in the component b), the conjugated aryl additive, is (I) or (II)

Another aspect of this novel composition is where component a) group is selected from (X), where further in the component b), the conjugated aryl additive, is (I).

Another aspect of this novel composition is where component a) group is selected from (X), where further in the component b), the conjugated aryl additive, is (II).

Another embodiment of the novel composition in any of the above described embodiment is where the conjugated aryl additive absorbs ultraviolet radiation strongly having a molar absorptivity between about 220 nm and 310 nm of between about 10 and 1000 m$^2$/mol. In another embodiment of this aspect of the invention the molar absorptivity is between 100 and 1000 m$^2$/mol. In still another embodiment it is between 200 and 1000 m$^2$/mol.

Another embodiment of the novel composition in any of the above described embodiment is where the conjugated aryl additive has a molar absorptivity at 248 nm between 10 and 1000 m$^2$/mol. In another embodiment of this aspect of the invention the molar absorptivity is between 100 and 1000 m$^2$/mol. In still another embodiment it is between 200 and 1000 m$^2$/mol.

Another embodiment of the novel composition in any of the above described embodiment is where the conjugated aryl additive has a molar absorptivity at 308 nm between 10 and 1000 m$^2$/mol. In another embodiment of this aspect of the invention the molar absorptivity is between 100 and 1000 m$^2$/mol. In still another embodiment it is between 200 and 1000 m$^2$/mol.

Methods of Forming Images with Broadband Radiation

The current application further discloses methods of forming negative relief images with all embodiments after exposure to broadband radiation. The compositions of the current disclosure are coated onto a chosen substrate and dried. The thus created film is then imagewise exposed through a negative mask using broadband radiation which output contains wavelengths between (350-450 nm) suitable to generate free radicals. The patterns that are exposed to the radiation cure or harden. Aqueous base developer is next applied to the film, and the areas which were not exposed to radiation are solubilized and removed from the substrate.

Coating can be accomplished by any of a number of coating methods, such as, for example, spin coating, slot coating, dip coating, curtain coating, roller coating, wire coating or other known methods. The thus applied coatings are dried of their solvent, to less than 5% solvent. Drying may be performed by hot plate heating, convection, infrared or other known methods for removing solvent from a coated film. In many thick film applications, imagewise exposure energies of less than 1000 mW at wavelengths greater than 300 nm are needed, such as 365 nm, 405 nm, 436 nm and broadband for instance between 350 and 450 nm. After exposure, an appropriate developer is applied to the film, such as 0.25N tetrabutylammonium hydroxide. The developer may be applied by spin coating, dipping, spraying or soaking, and may be about room temperature or may be heated depending on the solubility of the unexposed, as well as the exposed, photoresist in the developer. Typical applications for thick film photoresists require 3/1 aspect ratio, wherein the photoresist at 30-60 microns thicknesses create holes and trenches which are 15-70 microns wide.

Using either a coated film which has been blanket exposed with broadband radiation and crosslinked, or a topographical negative image created by exposure to broadband radiation through a mask followed by aqueous base development the blanket exposed film or remaining negative film in the negative image may be further patterned by cold laser ablation employing an Excimer laser emitting between 222 nm and 308 nm.

After removing the unexposed areas, patterns has been created in the film with the surface of the substrate now capable of further processing, such as, for example, electroplating metal into the relief areas, creating metal lines, bumps, trenches and other structures. The surface which has now been exposed may be subjected to etching of materials on the substrate. After etching, electroplating or other processing, the negative photoresist is removed or stripped, expect in those cases where the negative photoresist is designed to be a permanent material such as a permanent dielectric. Both electroplating and etching processes are well known in the art. Stripping solutions are generally strongly alkaline solutions and are generally heated above 100° F. Often the photoresist is cured to well that the photoresist does not dissolve on the stripping solution, but swells and is removed as a gel.

One embodiment of this invention is a process comprising steps a), b) and c) as follows:
  a) coating the composition of claim 1 on a substrate;
  b) cross-linking the entire coating by irradiation with broadband UV exposure;
  c) forming a pattern in the cross-linked coating by cold laser ablating with a UV excimer laser emitting between 222 nm and 308 nm.

In another embodiment of this inventive process the broadband UV exposure is between 350 and 450 nm.

In another embodiment of this inventive process the broadband UV exposure is between 350 and 450 nm the excimer laser emits at 248 nm.

In another embodiment of this inventive process the excimer laser emits at 308 nm.

Another embodiment of this invention is a process comprising steps a), b) c), and d) as follows:

a) coating the composition of claim 1 on a substrate;
b) cross-linking part of the coating by irradiation with broadband UV exposure;
c) developing the coating with aqueous base removing the unexposed areas of the film, thereby forming a first pattern;
d) forming a second pattern in the first pattern by laser cold laser ablating with a UV excimer laser emitting between 222 nm and 308 nm.

In another embodiment of this process the excimer laser emits at 248 nm.

In a further embodiment of this process the excimer laser emits at 308 nm.

EXAMPLES

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Unless otherwise indicated all chemical were obtained from Sigma Aldrich (St. Louis, Mo.).

Polymer Synthesis Example 1

6.49 g of acrylic acid, 8.85 g of styrene, 21.62 g of hydroxypropyl methacrylate, and 24.89 g of tert-butyl methacrylate were admixed in 117.9 g of PGME solvent. The polymerization reaction proceeded with stirring in the presence of 1.64 g of AIBN at 90° C., under nitrogen for 18 hours. After cooling down to room temperature the reaction mixture was precipitated in DI water. The white polymer solid was washed and dried under vacuum at 50° C., yielding 61.0 g (98% yield) with a weight average molecular weight of 15496.

Formulation Example 1

35.34 g of the polymer prepared from Example 1, above, was admixed with 21.66 g of propylene glycol monomethyl ether acetate, 14.14 g of SR268 (from Sartomer Corp, Exton, Pa.), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp, Tokyo 103-8233, Japan), 2.00 g of 2-(4-methoxyphenyl)-4,6-bis(trichloromethyl)-1,3,5-triazine (MPTT) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm². The resulting film was laser ablated (Table 1 and FIG. 1).

Formulation Example 2

35.34 g of the polymer prepared from Example 1, above, was admixed with 21.66 g of propylene glycol monomethyl ether acetate, 14.14 g of SR268 (from Sartomer Corp), and 21.21 g of DHDMA (from Sartomer Corp). After rolling overnight, 3.54 g of Irgacure® 907 (2-Methyl-1((4-methylthio)phenyl)-2-morpholino propan-1-one available from BASF, Ludwigshafen, Germany) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp), 2.00 g of methoxy naphthalene (MN) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm². The resulting film was laser ablated (Table 1).

Formulation Example 3

35.34 g of the polymer prepared from Example 1, above, was admixed with 21.66 g of propylene glycol monomethyl ether acetate, 14.14 g of SR268 (from Sartomer Corp), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp), 2.00 g of 1,5-dihydroxynaphthalene (DHN) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm². The resulting film was laser ablated (Table 1).

Formulation Example 4

35.34 g of the polymer prepared from Example 1, above, was admixed with 21.66 g of propylene glycol monomethyl ether acetate, 14.14 g of SR268 (from Sartomer Corp), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp), 2.00 g of 9-fluorenone (9-FN) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm². The resulting film was laser ablated (Table 1).

Formulation Example 5

35.34 g of the polymer prepared from Example 1, above, was admixed with 21.66 g of propylene glycol monomethyl ether acetate, 14.14 g of SR268 (from Sartomer Corp), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp), 2.00 g of 9-anthracene methanol (9-AM) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm$^2$. The resulting film was laser ablated (Table 1).

Formulation Example 6

35.34 g of the polymer prepared from Example 1, above, was admixed with 21.66 g of propylene glycol monomethyl ether acetate, 14.14 g of SR268 (from Sartomer Corp, Exton, Pa.), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp, Tokyo 103-8233, Japan), 2.00 g of 9-Phenanthrol (9-Ph), and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm$^2$. The resulting film was laser ablated (Table 1).

Formulation Example 7

35.34 g of the polymer prepared from Example 1, above, was admixed with 21.66 g of propylene glycol monomethyl ether acetate, 14.14 g of SR268 (from Sartomer Corp, Exton, Pa.), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp, Tokyo 103-8233, Japan), 2.00 g of Pyrene, and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 1200 mJ/cm$^2$. The resulting film was laser ablated (Table 1).

Formulation Example 8

36.06 g of the polyGK65 (from Dupont) was admixed with 21.66 g of propylene glycol monomethyl ether acetate, 14.14 g of SR268 (from Sartomer Corp), and 21.21 g of 2,5-dimethyl-2,5-hexanediol dimethacrylate (DMHMA) (from ENF). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp), 2.00 g of 2-(4-methoxyphenyl)-4,6-bis(trichloromethyl)-1,3,5-triazine (MPTT) and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. The resist coating was exposed at 2000 mJ/cm$^2$. The resulting film was laser ablated (Table 1).

Formulation Example 9

36.1 g of Cresol novolak resin (from AZ Electronic Materials) and 5.3 g Cymel 301 as crosslinker (from AZ Electronic Materials) were admixed with 56.3 g of propylene glycol monomethyl ether acetate. After rolling overnight, 1.1 g of NIT PAG (available from Heraeus-Daychem) and 0.02 g of APS437 (available from available from D.H. Litter Co) and 2.00 g of 2-(4-methoxyphenyl)-4,6-bis(trichloromethyl)-1,3,5-triazine (MPTT) were admixed and the admix was rolled for 2 days. The composition was filtered and spin coated on a silicon wafer and dried on a hot plate for 3 min at 140° C. The dried coating was measured to be 50 microns thick. The resist coating was exposed at 1200 mJ/cm$^2$. The resulting film was performed laser ablation.

Comparative Formulation Example 1

35.34 g of the polymer prepared from Example 1, above, was admixed with 21.66 g of propylene glycol monomethyl ether acetate, 14.14 g of SR268 (from Sartomer Corp, Exton, Pa.), and 21.21 g of DHDMA (from Sartomer Corp). After rolling overnight, 3.54 g of Irgacure® 907 (2-Methyl-1((4-methylthio)phenyl)-2-morpholino propan-1-one available from BASF) and 1.76 g of Irgacure® 819 (Bis(2,4,6-trimethylbenzoyl)-phenyl phosphineoxide available from BASF) were admixed. 0.01 g of Megafac R08 (from Dinippon Ink and Chemical Corp, Tokyo 103-8233, Japan), and 0.25 g CGL 1198 inhibitor were admixed and the admix was rolled for 2 days. The composition was filtered and spin coated on a silicon wafer and dried on a hot plate for 5 min at 140° C. The dried coating was measured to be 50 microns thick. Different resist coatings was exposed at 300 mJ/cm$^2$ (25% cure) or 1200 mJ/cm$^2$ (100% cure). The resulting film was laser ablated but all coatings had no effective capacity to undergo laser ablation to form contact holes (FIG. 1).

Broadband and Laser Ablation (with 308 nm) Processing Results:

Laser Ablation Comparisons.

The laser ablations results are summarized in Table 1. These results were obtained from coatings on silicon wafers using Formulation Examples 1-9 and Comparative Example 1. These coatings were obtained by spin coating the formulation unto the wafers at a spin speed of 1000 rpm to 2400 rpm then baking the coating at a temperature of 140° C. for 5 min using a Suss ACS300 plus track giving coating having a thickness of 50 microns. The coated wafer were then "cured" with a Broadband radiation exposure (350-450 nm) using a Suss MA-200 Mask Aligner. The cured coatings prepared with Formulations Examples 1-7 and 9 were exposed to 1200 mJ/cm$^2$ (100% cure) and Formulation Example 8 to 2000 mJ/cm$^2$ (100% cure), while the coatings prepared from the Comparative Example 1 where either exposed to 1200 mJ/cm$^2$ (100% cure) or 300 mJ/cm$^2$ (25% cure). The cured wafers were ablated using a Suss Excimer Laser Stepper: model M410. Excimer lasers (XeCl, 308 nm and KrF, 248 nm). These Laser ablation tools are routinely used in various microfabrication, micromachining, and surface modification applications. The excimer laser is very effective in polymer ablation due to the short pulse duration and high peak power. The fluence was in the range of 200-1000 mJ/cm$^2$ and frequency was 100 Hz. The ablated vias were characterized by top down scanning electron microscopy (SEM). As summarized in Table 1 all coating prepared form formulations Example 1-9 gave good laser ablation which was used to produce via contact holes ranging in size from 40 to 200 microns having good wall angles of at least 78°.

TABLE 1

Summary of the Formulation Examples and Comparative example

| Formulation Example # | Composition Types | Addtives | Ablation results with 365 nm Laser |
|---|---|---|---|
| 1 | X | MPTT | Ablated |
| 2 | X | MN | Ablated |
| 3 | X | DHN | Ablated |
| 4 | X | 9-FN | Ablated |
| 5 | X | 9-AM | Ablated |
| 6 | X | 9-Ph | Ablated |
| 7 | X | Pyrene | Ablated |
| 8 | VIV | MPTT | Ablated |
| 9 | VIII | MPTT | Ablated |
| Comparative #1 | X | N/A | No ablation |

FIG. 1 shows a comparison of top down SEM pictures which illustration the attempted formation of via holes with laser ablation using a 308 nm laser in coatings prepared from formulations which either do contain, or do not contain a laser ablation additive MPTT.

Specifically, coatings prepared with "Comparative Formulation Example 1" which does not contain the laser ablation additive MPTT give no effective ablation to form a contact hole. This is true with either a film which is UV cured at 25% or 100% prior to laser ablation with the 308 nm laser. In contrast Example 1 with 2 wt % of MPTT shows an ablation rate of 1.49 µm/pulse and gives via hole with a 78.1° sidewall angle was achieved.

We claim:

1. A process comprising steps A, B and C:

A coating on a substrate a composition for a negative tone, aqueous base developable, broadband UV resist which is also sensitive in the areas exposed to broadband irradiation to subsequent cold laser ablation by an UV Excimer Laser emitting at 308 nm wherein said composition consists of components of type a-1), b-1), c-1) a solvent, d-1) a surfactant and e-1) an inhibitor; wherein:

a-1) are components for imparting negative tone, aqueous base developable, broadband UV resist behavior comprised of (i) is at least one polymeric resin comprising a structure of the following formula:

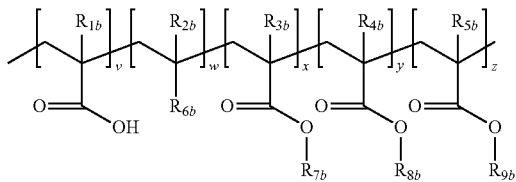

wherein each of $R_{1b}$-$R_{5b}$ is independently selected from the group consisting of H, F and $CH_3$, $R_{6b}$ is selected from the group consisting of a substituted aryl, unsubstituted aryl, substituted heteroaryl and unsubstituted heteroaryl group; $R_{7b}$ is a substituted or unsubstituted benzyl group; $R_{8b}$ is selected from the group consisting of a linear or branched $C_2$-$C_{10}$ hydroxy alkyl group and a $C_2$-$C_{10}$ hydroxy alkyl acrylate; $R_{9b}$ is an acid cleavable group, v=10-40 mole %, w=0-35 mole %, x=0-60 mole %, y=10-60 mole % and z=0-45 mole %, (ii) is one or more free radical initiators activated by actinic radiation, and (iii) is one or more crosslinkable acrylated monomers capable of undergoing free radical crosslinking wherein the acrylate functionality is greater than 1;

b-1) is a cold laser ablation excimer laser sensitizer component system consisting of (II);

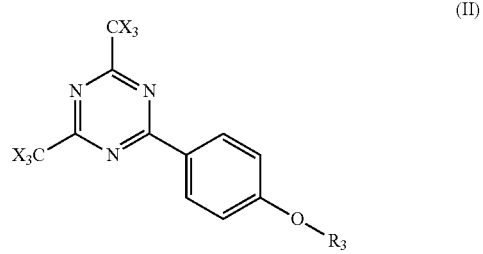

wherein $R_3$ is selected from the group consisting of hydrogen, an alkyl group, an alkylenefluoroalkyl group, an alkylene aryl group, and an alkyleneoxyalkyl group and X is selected from the group consisting of Cl, Br or I; and further wherein said cold laser ablation excimer laser sensitizer component system comprises from 2 to 10 wt % of the composition, and wherein the composition is one which can be coated to a thickness from 30 to 60 microns;

B cross-linking the entire coating by blanket irradiation with broadband UV exposure; and C forming a pattern in the cross-linked coating by cold laser ablating with a UV excimer laser emitting at 308 nm.

2. The process of claim 1 wherein, b1), the conjugated aryl additive is (II), is one wherein, $R_3$ is an alkyl group, and X is Cl.

3. The process of claim 1 where the broadband UV exposure is between 350 and 450 nm.

4. The process of claim 1 wherein said solvent is selected from the group consisting of propylene glycol mono-alkyl ethers, propylene glycol alkyls, 2-heptanone, 3-methoxy-3-methyl butanol, butyl acetate, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, 2-heptanone, monooxymonocarboxylic acid esters, methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate, ethyl 3-hydroxypropionate, propyl 2-oxypropionate, methyl 2-ethoxypropionate, propyl 2-methoxy propionate, propylene glycol monomethyl ether acetate and mixtures thereof.

5. A process comprising steps A, B, C and D:

A coating on a substrate a composition for a negative tone, aqueous base developable, broadband UV resist which is also sensitive in the areas exposed to broadband irradiation to subsequent cold laser ablation by an UV Excimer Laser emitting at 308 nm wherein, said composition consists of components of type a-1), b-1), c-1) a solvent, d-1) a surfactant and e-1) an inhibitor;

wherein:
a-1) are components for imparting negative tone, aqueous base developable, broadband UV resist behavior comprised of
(i) is at least one polymeric resin comprising a structure of the following formula:

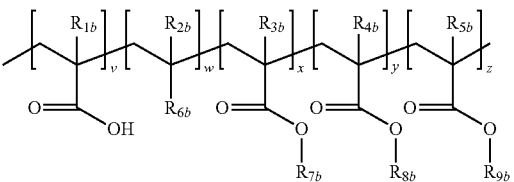

wherein each of $R_{1b}$-$R_{5b}$ is independently selected from the group consisting of H, F and $CH_3$, $R_{6b}$ is selected from the group consisting of a substituted aryl, unsubstituted aryl, substituted heteroaryl and unsubstituted heteroaryl group; $R_{7b}$ is a substituted or unsubstituted benzyl group; $R_{8b}$ is selected from the group consisting of a linear or branched $C_2$-$C_{10}$ hydroxy alkyl group and a $C_2$-$C_{10}$ hydroxy alkyl acrylate; $R_{9b}$ is an acid cleavable group, v=10-40 mole %, w=0-35 mole %, x=0-60 mole %, y=10-60 mole % and z=0-45 mole %,
(ii) is one or more free radical initiators activated by actinic radiation, and
(iii) is one or more crosslinkable acrylated monomers capable of undergoing free radical crosslinking wherein the acrylate functionality is greater than 1;
b-1) is a cold laser ablation excimer laser sensitizer component system consisting of (II);

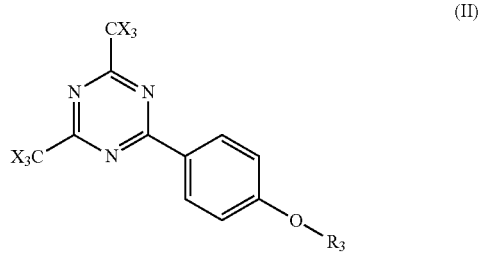

(II)

wherein $R_3$ is selected from the group consisting of hydrogen, an alkyl group, an alkylenefluoroalkyl group, an alkylene aryl group, and an alkyleneoxyalkyl group and X is selected from the group consisting of Cl, Br or I; and further wherein said cold laser ablation excimer laser sensitizer component system comprises from 2 to 10 wt % of the composition, and wherein the composition is one which can be coated to a thickness from 30 to 60 microns, B cross-linking part of the coating by irradiation with broadband UV exposure through a mask;

C developing the coating with aqueous base removing the unexposed areas of the coating, thereby forming a first pattern;

D forming a second pattern in the first pattern by cold laser ablating of the first pattern with a UV excimer laser emitting at 308 nm.

6. The process of claim 5 wherein, b1), the conjugated aryl additive (II), is one wherein $R_3$ is an alkyl group, and X is Cl.

7. The process of claim 5 wherein said solvent is selected from the group consisting of propylene glycol mono-alkyl ethers, propylene glycol alkyls, 2-heptanone, 3-methoxy-3-methyl butanol, butyl acetate, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, 2-heptanone, monooxymonocarboxylic acid esters, methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate, ethyl 3-hydroxypropionate, propyl 2-oxypropionate, methyl 2-ethoxypropionate, propyl 2-methoxy propionate, propylene glycol monomethyl ether acetate and mixtures thereof.

* * * * *